(12) United States Patent
Hong et al.

(10) Patent No.: US 11,450,264 B2
(45) Date of Patent: Sep. 20, 2022

(54) DISPLAY DEVICE

(71) Applicant: Samsung Display Co., Ltd., Yongin-Si (KR)

(72) Inventors: Sung Jin Hong, Yongin-si (KR); Yoo Min Ko, Yongin-si (KR); Gun Hee Kim, Yongin-si (KR); Seung Chan Lee, Yongin-si (KR)

(73) Assignee: Samsung Display Co., Ltd.

( * ) Notice: Subject to any disclaimer, the term of this patent is extended or adjusted under 35 U.S.C. 154(b) by 71 days.

(21) Appl. No.: 17/019,077

(22) Filed: Sep. 11, 2020

(65) Prior Publication Data

US 2021/0225265 A1 Jul. 22, 2021

(30) Foreign Application Priority Data

Jan. 22, 2020 (KR) ........................ 10-2020-0008342

(51) Int. Cl.
*G09G 3/32* (2016.01)
*H01L 27/32* (2006.01)
*G09G 3/3225* (2016.01)

(52) U.S. Cl.
CPC ............. *G09G 3/32* (2013.01); *H01L 27/326* (2013.01); *H01L 27/3225* (2013.01);
(Continued)

(58) Field of Classification Search
CPC ............. G09G 3/32; G09G 2300/0809; G09G 2320/02; G09G 2330/02; G09G 2300/0426; G09G 2300/0819; G09G 2300/0842; G09G 2300/0861; G09G 2310/0251; G09G 2340/0407; G09G 2360/14; G09G 3/3233; G09G 3/3225; G09G 2310/0245; G09G 2320/0233; G09G 2320/0686; H01L 27/3225; H01L 27/3262; H01L 27/3276; H01L 27/3211; H01L 27/3213; H01L 27/3246; H01L 27/3248; H01L 27/3279; H01L 27/3265; H01L 51/52;
(Continued)

(56) References Cited

U.S. PATENT DOCUMENTS

| | | | |
|---|---|---|---|
| 2015/0062193 A1* | 3/2015 | Kanda ................... | G09G 3/3233 345/77 |
| 2020/0117782 A1* | 4/2020 | Lee .......................... | G06K 9/00 |
| 2021/0202588 A1* | 7/2021 | Cho ..................... | H01L 27/3202 |

FOREIGN PATENT DOCUMENTS

| | | | | |
|---|---|---|---|---|
| CN | 109950288 B | * | 5/2021 | |
| WO | WO-2018186580 A1 | * | 10/2018 | ............. G06F 21/32 |

* cited by examiner

*Primary Examiner* — Douglas M Wilson
(74) *Attorney, Agent, or Firm* — Innovation Counsel LLP

(57) ABSTRACT

The display device includes a substrate including a sensor area, a display panel including a first pixel disposed in the sensor area, and a sensor disposed between the substrate and the display panel and overlapping the sensor area. The sensor area includes pixel areas in which the first pixel is disposed and transmission areas in which the first pixel is not disposed, the transmission areas include a first transmission area, the pixel areas include a first pixel area positioned in a first direction of the first transmission area and a second pixel area positioned in a second direction crossing the first direction of the first transmission area, the first pixel includes a first pixel circuit, some of transistors of the first pixel circuit are disposed in the first pixel area, and others of the transistors of the first pixel circuit are disposed in the second pixel area.

19 Claims, 15 Drawing Sheets

(52) U.S. Cl.
CPC ...... *H01L 27/3262* (2013.01); *H01L 27/3276* (2013.01); *G09G 3/3225* (2013.01); *G09G 2300/0426* (2013.01); *G09G 2300/0809* (2013.01); *G09G 2320/02* (2013.01); *G09G 2320/0233* (2013.01); *G09G 2320/0686* (2013.01); *G09G 2330/02* (2013.01); *G09G 2340/0407* (2013.01); *H01L 27/3211* (2013.01); *H01L 27/3213* (2013.01); *H01L 27/3218* (2013.01); *H01L 27/3223* (2013.01); *H01L 27/3227* (2013.01); *H01L 27/3234* (2013.01)

(58) Field of Classification Search
CPC ............... H01L 27/326; H01L 27/3218; H01L 27/3223; H01L 27/3227; H01L 27/3234; H01L 51/56
See application file for complete search history.

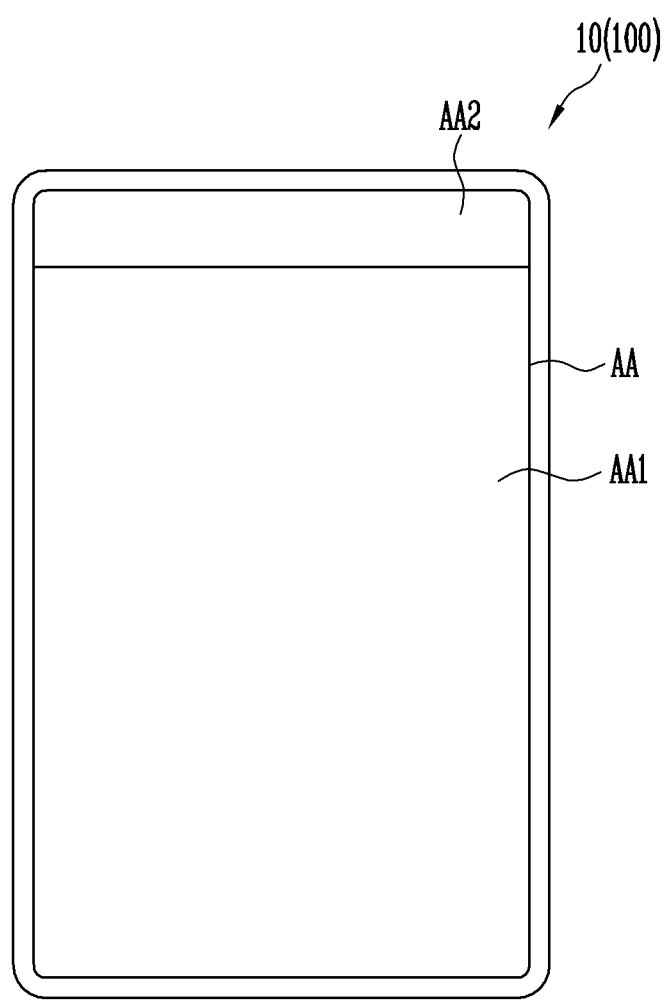

DISPLAY DEVICE

CROSS-REFERENCE TO RELATED APPLICATIONS

This application claims priority to Korean Patent Application No. 10-2020-0008342, filed on Jan. 22, 2020, and all the benefits accruing therefrom under 35 U.S.C. § 119, the content of which in its entirety is herein incorporated by reference.

BACKGROUND

1. Field

Generally, the current disclosure relates to a display device. More particularly, the current disclosure relates to the display device having an improved recognition accuracy of a sensor disposed in a sensor area by increasing the area of a transmission area included in a sensor area.

2. Description of the Related Art

Importance of a display device is increasing with development of multimedia. Recently, various display devices, such as a liquid crystal display (LCD) and an organic light emitting diode (OLED) display device have been widely developed.

The display panel may include a sensor area and plurality of sensors which may overlap the sensor area under the display panel. The sensor area may include a pixel area and a transmission area. The display device may recognize an object by using an optical sensor, and obtain a picture and a video by using a camera. Recently, development on front display technology for minimizing the size of the bezel on a front screen of the display device, rearranging sensors on the front screen, and displaying an image on the entire front screen of the display device have been conducted.

However, when the area of the transmission area is set to be narrow, a light amount (or a signal amount) incident through the transmission area may not be sufficient, and thus recognition accuracy of the sensor disposed in the sensor area may be degraded. Thus, there is need to develop a novel way to improve display quality of the display panel.

SUMMARY

The current disclosure is to provide a display device having an improved recognition accuracy of a sensor disposed in a sensor area by increasing the area of a transmission area included in the sensor area.

The current disclosure is not limited, and other technologies which are not described above will be clearly understood by those skilled in the art from the following description.

A display device according to an embodiment of the disclosure for resolving the above-described object includes a substrate including a sensor area, a display panel including a first pixel disposed in the sensor area, and a sensor disposed between the substrate and the display panel and overlapping the sensor area. The sensor area includes a plurality of pixel areas in which the first pixel is disposed and a plurality of transmission areas in which the first pixel is not disposed, the plurality of transmission areas include a first transmission area, the plurality of pixel areas include a first pixel area positioned in a first direction of the first transmission area and a second pixel area positioned in a second direction crossing the first direction of the first transmission area, the first pixel includes a first pixel circuit, at least one of transistors of the first pixel circuit is disposed in the first pixel area, and others of the transistors of the first pixel circuit are disposed in the second pixel area.

The first pixel circuit may include a first initialization transistor disposed in the second pixel area and connected between a first light emitting element of the first pixel and an initialization power.

The display panel may include a first scan line, a first initialization line, and a first emission control line connected to the first pixel circuit, and the first scan line, the first initialization line, and the first emission control line may pass through the first pixel area and bypass the transmission area adjacent to the first pixel area.

The pixel circuit may further include a first transistor, a second transistor, and a capacitor disposed in the first pixel area, the first transistor may control a current amount flowing from a first power to a second power via the first light emitting element in correspondence with a voltage of a first node, the second transistor may be connected between a data line and a first electrode of the first transistor, and may be turned on when a scan signal is supplied to the first scan line, and the capacitor may be connected between the first power and the first node.

The pixel circuit may further include a third transistor, a fourth transistor, a fifth transistor, and a sixth transistor disposed in the first pixel area, the third transistor may be connected between the first node and a second electrode of the first transistor, and may be turned on when the scan signal is supplied to the first scan line, the fourth transistor may be connected between the first node and the initialization power, and may be turned on when an initialization signal is supplied to the first initialization line, the fifth transistor may be connected between the first power and the first electrode of the first transistor, and may be turned on when an emission control signal is supplied to the first emission control line, and the sixth transistor may be connected between the second electrode of the first transistor and a first electrode of the first light emitting element, and may be turned on when the emission control signal is supplied to the first emission control line.

The pixel areas may further include a third pixel area positioned in a direction opposite to the first direction of the first transmission area, a second pixel may be further disposed in the pixel areas, the second pixel may include a second pixel circuit, at least one portion of the second pixel circuit may be disposed in the second pixel area, and an other portion of the second pixel circuit may be disposed in the third pixel area.

The second pixel circuit may include a second initialization transistor disposed in the third pixel area and connected between a second light emitting element of the second pixel and the initialization power.

The display panel may include a second scan line and a second initialization line connected to the second pixel circuit, and the second scan line and the second initialization line may pass through the second pixel area and bypass the transmission area adjacent to the second pixel area.

The first initialization transistor may be turned on when an initialization signal is supplied to the second initialization line.

The initialization signal supplied to the second initialization line may be equal to the scan signal supplied to the first scan line.

The pixel areas may further include a third pixel area positioned in the first direction of the first pixel area, a second pixel may be further disposed in the pixel areas, the second pixel may include a second pixel circuit, at least one portion of the second pixel circuit may be disposed in the third pixel area, and an other portion of the second pixel circuit may be disposed in the first pixel area.

The second pixel circuit may include a second initialization transistor disposed in the first pixel area and connected between a second light emitting element of the second pixel and the initialization power.

The display panel may include a connection pattern that electrically connects an anode electrode of the first light emitting element and the first initialization transistor to each other and is not overlapping the transmission areas.

At least one of the transistors included in the first pixel circuit may include a base layer disposed on the substrate, a semiconductor pattern disposed on the base layer, a gate electrode disposed on the semiconductor pattern, and a first metal pattern and a second metal pattern that is disposed on the gate electrode and is in contact with the semiconductor pattern, and the connection pattern is formed between the base layer and the gate electrode or on the same layer as the gate electrode.

The display panel may further include a display area in which a display pixel is disposed, the display area may surround the sensor area, and a disposition density of the first pixels disposed in the sensor area may be lower than a disposition density of the display pixels disposed in the display area.

A size of the first pixels disposed in the sensor area may be smaller than a size of the display pixels disposed in the display area.

A transmittance of the sensor area may be greater than a transmittance of the display area.

A display device according to another embodiment of the disclosure for resolving the above-described object includes a substrate including a sensor area, a display panel including a first pixel circuit and a second pixel circuit disposed in the sensor area, and a sensor disposed between the substrate and the display panel and overlapping the sensor area. The sensor area includes a transmission area, at least one of the transistors of the first pixel circuit is disposed adjacent to a first direction of the transmission area, others of the transistors of the first pixel circuit are disposed adjacent to a second direction crossing the first direction of the transmission area, and the second pixel circuit is disposed adjacent to the second direction of the transmission area.

The display panel may further include a first light emitting element disposed adjacent to the first direction of the transmission area and connected to the first pixel circuit, the first pixel circuit may include an initialization transistor disposed adjacent to the second direction of the transmission area, and the initialization transistor may be connected between an anode electrode of the first light emitting element and an initialization power.

The display panel may further include a third pixel circuit, at least one of the transistors of the third pixel circuit may be disposed adjacent to the second direction of the second pixel circuit, and others of the transistors of the third pixel circuit may be disposed adjacent to the second direction of the transmission area.

Specific details of other embodiments are included in the detailed description and drawings.

According to embodiments of the disclosure, light emitting elements disposed in one pixel area of the sensor area may be connected to initialization transistors disposed in another pixel area. Therefore, a display device having an enlarged area of the transmission area in the sensor area and an improved recognition accuracy of the sensor disposed in the sensor area may be provided.

The effect according to the embodiments is not limited by the details exemplified above, more various effects are included in the present specification.

BRIEF DESCRIPTION OF THE DRAWINGS

The above and other features of the disclosure will become more apparent by describing in further detail embodiments thereof with reference to the accompanying drawings, in which:

FIGS. 3A and 3B are plan views of the display device according to an embodiment of the disclosure;

DETAILED DESCRIPTION OF THE EMBODIMENT

Figure 1:
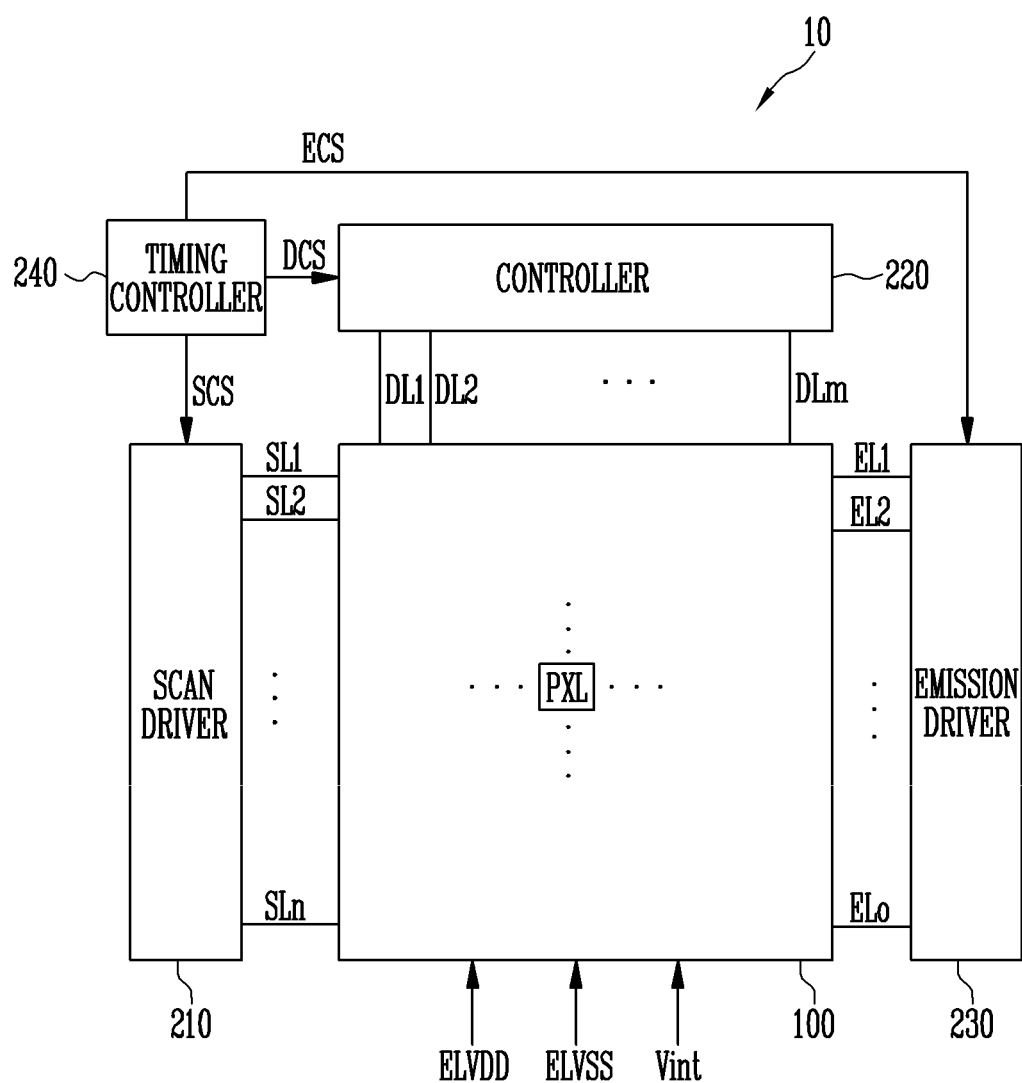
FIG. 1 is a block diagram illustrating a schematic configuration of a display device according to an embodiment.

The advantages and features of the current disclosure and a method of achieving them will become apparent with reference to the embodiments described in detail below together with the accompanying drawings. However, the disclosure is not limited to the embodiments disclosed below, and may be implemented in various different forms. The present embodiments are provided so that the disclosure will be thorough and complete and those skilled in the art to which the disclosure pertains can fully understand the scope of the disclosure. The current disclosure is only defined by the scope of the claims.

A case in which an element or a layer is referred to as "on" another element or layer includes a case in which another layer or another element is disposed directly on the other element or between the other layers. The same reference numerals denote to the same components throughout the specification.

Although a first, a second, and the like are used to describe various components, it goes without saying that these components are not limited by these terms. These terms are used only to distinguish one component from another component. Therefore, it goes without saying that a first component mentioned below may be a second component within the technical spirit of the disclosure. The singular expressions include plural expressions unless the context clearly dictates otherwise.

Hereinafter, embodiments of the disclosure will be described in detail with reference to the accompanying drawings. The same or similar reference numerals are used for the same components in the drawings.

FIG. 1 is a block diagram illustrating a schematic configuration of a display device according to an embodiment.

Referring to FIG. 1, a display device 10 according to an embodiment may include a display panel 100 including a plurality of pixels PXL, a scan driver 210, a data driver 220, an emission driver 230, and a timing controller 240. In addition, the display device 10 may include a plurality of scan lines from SL1 to SLn (n is a natural number greater than 1), a plurality of data lines from DL1 to DLm (m is a natural number greater than 1), and a plurality of emission control lines EL1 to ELo (o is a natural number greater than 1) disposed on the display panel 100.

The timing controller 240 may generate a scan driving control signal SCS, a data driving control signal DCS, and an emission driving control signal ECS based on signals input from an external source (not shown). The driving control signals SCS, DCS, and ECS generated by the timing controller 240 may be supplied to the scan driver 210, the data driver 220, and the emission driver 230 respectively.

The scan driving control signal SCS may include a scan start pulse and clock signals. The scan start pulse may control an output timing of a first scan signal, and the clock signals may control an output timing of the scan signals.

The data driving control signal DCS may include a source start pulse and clock signals. The source start pulse may control a sampling start time of data, and the clock signals may be used to control a sampling operation.

The emission driving control signal ECS may include an emission start pulse and clock signals. The emission start pulse may control an output timing of a first emission control signal, and the clock signals may control an output timing of emission control signals.

The scan driver 210 may output a scan signal in correspondence with the scan driving control signal SCS. The scan driver 210 may supply the scan signal to scan lines from SL1 to SLn. The scan signal may be sequentially or simultaneously applied to the scan lines SL1 to SLn.

The data driver 220 may supply data signals to the data lines from DL1 to DLm in correspondence with the data driving control signal DCS. The data signals supplied to the data lines from DL1 to DLm may be applied to the pixels PXL of a pixel row selected by the scan signal. To this end, the data driver 220 may supply the data signals to the data lines from DL1 to DLm in synchronization with the scan signal.

The data driver 220 may apply data signals corresponding to image data provided from the outside to the data lines from DL1 to DLm during a display period in one frame.

The emission driver 230 may supply the emission control signals to the emission control lines from EL1 to ELo in correspondence with the emission driving control signal ECS. The emission control signal may be sequentially or simultaneously applied to the emission control lines from EL1 to ELo. The pixels PXL supplied with the emission control signals through the emission control lines from EL1 to ELo may emit light at a luminance corresponding to the data signals applied from the data driver 220.

The display panel 100 may include a plurality of pixels PXL connected to the data lines from DL1 to DLm, the scan lines from SL1 to SLn, and the emission control lines from EL1 to ELo. At least one or more scan lines may be connected to the pixel PXL in correspondence with a circuit structure of the pixel PXL.

The pixels PXL may be connected to a first power ELVDD and a second power ELVSS to receive a driving power voltage. A first power voltage supplied by the first power ELVDD may be set to a voltage higher than a second power voltage supplied by the second power ELVSS. In addition, the pixels PXL may be further connected to an initialization power Vint to receive an initialization power voltage.

Each of the plurality of pixels PXL may receive a data signal from a corresponding data line when a scan signal is supplied through a corresponding scan line during the display period. The pixel PXL receiving the data signal may control a current amount flowing from the first power ELVDD to the second power ELVSS through a light emitting element (not shown) in correspondence with the data signal. When an emission control signal is applied from a corresponding emission control line, the light emitting element may generate light of a predetermined luminance in correspondence with the current amount.

Figure 2A:
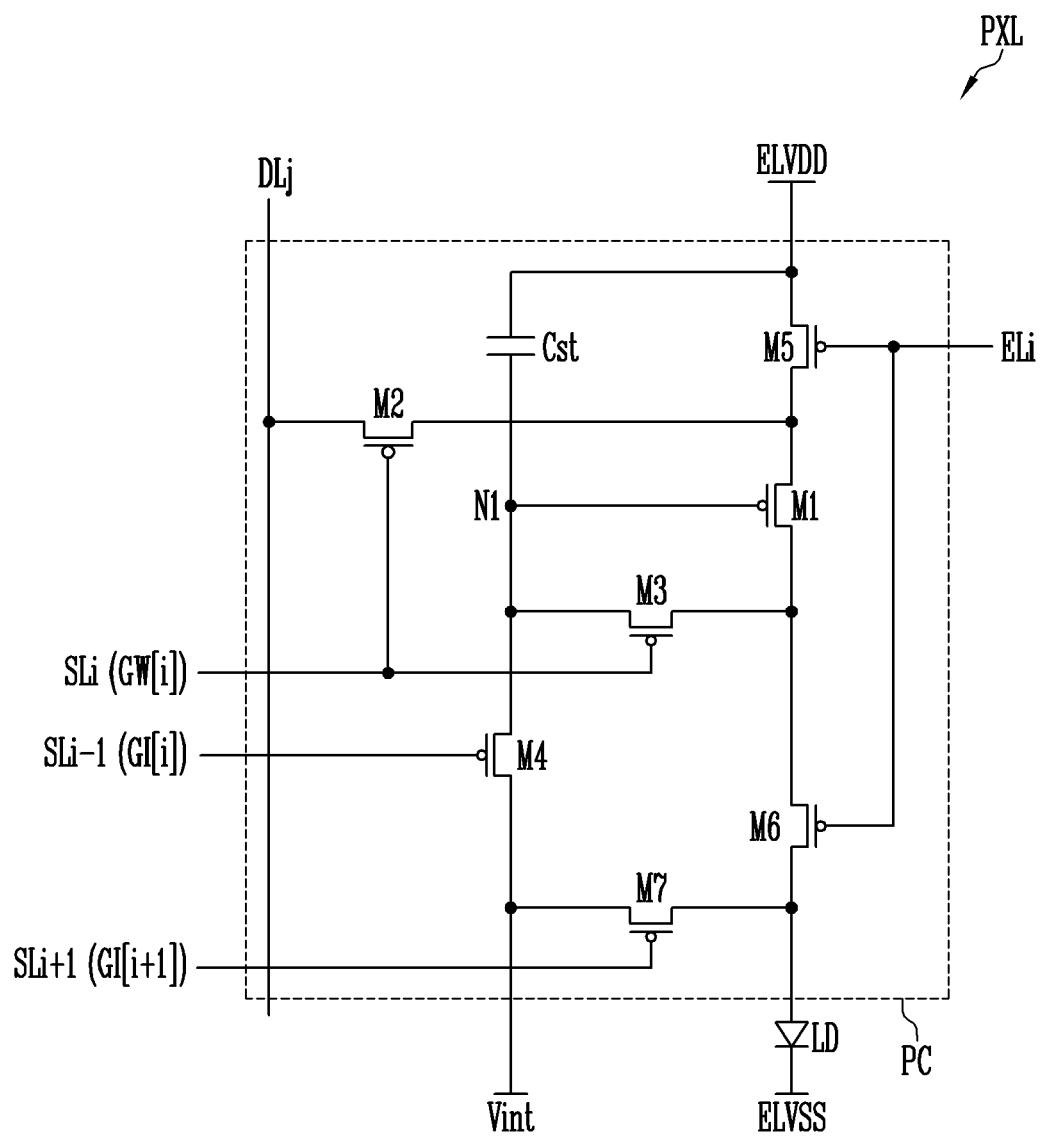
FIG. 2A is a circuit diagram illustrating an embodiment of a pixel shown in FIG. 1.

FIG. 2A is a circuit diagram illustrating an embodiment of the pixel shown in FIG. 1.

Referring to FIG. 2A, the pixel PXL according to an embodiment of the disclosure may include a pixel circuit PC including a first, a second, a third, a fourth, a fifth, a sixth, and a seventh transistors M1, M2, M3, M4, M5, M6, and M7, a storage capacitor Cst, and a light emitting element LD.

The pixel PXL according to an embodiment may be connected between a first scan line SLi, a second scan line SLi−1, a third scan line SLi+1, a data line DLj, an emission control line Eli, the first power ELVDD, the second power ELVSS, and the initialization power Vint.

Each of the first to seventh transistors M1 to M7 may be implemented as a P-type transistor, but is not limited. For example, at least some of the first to seventh transistors M1 to M7 may be implemented as N-type transistors.

A first electrode of the first transistor M1 may be connected to the first power ELVDD through the fifth transistor M5, and a second electrode of the first transistor M1 may be connected to a first electrode (for example, an anode electrode) of the light emitting element LD through the sixth transistor M6. In addition, a gate electrode of the first transistor M1 may be connected to a first node N1. The first transistor M1 may control a current amount flowing from the first power ELVDD to the second power ELVSS through the light emitting element LD in correspondence with a voltage of the first node N1.

The second transistor M2 (switching transistor) may be connected between the data line Dj and the first electrode of the first transistor M1. In addition, a gate electrode of the second transistor M2 may be connected to the first scan line SLi. The second transistor M2 may be turned on when a first scan signal GW[i] is supplied to the first scan line SLi to electrically connect the data line Dj and the first electrode of the first transistor M1 to each other.

The third transistor M3 may be connected between the second electrode of the first transistor M1 and the first node N1. In addition, a gate electrode of the third transistor M3 may be connected to the first scan line SLi. The third transistor M3 may be turned on when a scan signal of a gate-on voltage is supplied to the first scan line SLi to electrically connect the second electrode of the first transistor M1 and the first node N1 to each other. Therefore, when the third transistor M3 is turned on, the first transistor M1 may be connected in a diode form.

The fourth transistor M4 may be connected between the first node N1 and the initialization power Vint. In addition, a gate electrode of the fourth transistor M4 may be connected to the second scan line SLi−1 (or an initialization line). The fourth transistor M4 is turned on when a second scan signal GI[i] (or an initialization signal) is supplied to the second scan line SLi−1 to supply a voltage of the initialization power Vint to the first node N1. That is, the fourth transistor M4 may be a gate initialization transistor that initializes the gate electrode of the first transistor M1. Here, the second scan signal GI[i] may be a signal having the same waveform as the first scan signal provided by the first scan line of the pixel positioned in a previous row.

FIG. 2A shows an embodiment in which the second scan line SLi−1 is used as an initialization line for initializing the gate node of the first transistor M1, that is, the first node N1. However, the technical scope of the disclosure is not limited.

The fifth transistor M5 may be connected between the first power ELVDD and the first transistor M1. In addition, a gate electrode of the fifth transistor M5 may be connected to the emission control line ELi.

The sixth transistor M6 may be connected between the first transistor M1 and the light emitting element LD. In addition, a gate electrode of the sixth transistor M6 may be connected to the emission control line ELi.

The fifth transistor M5 and the sixth transistor M6 may be turned off when an emission control signal (for example, a high level voltage) of a gate-off voltage is supplied to the emission control line Eli, and may be turned on when an emission control signal (for example, a low level voltage) of a gate-on voltage is supplied.

The seventh transistor M7 (or an initialization transistor) may be connected between the initialization power Vint and the first electrode (an anode electrode) of the light emitting element LD. A gate electrode of the seventh transistor M7 may be connected to a third scan line SLi+1. The seventh transistor M7 may be turned on when a third scan signal GI[i+1] of a gate-on voltage (for example, a low level voltage) is supplied to the third scan line SLi+1 to supply the voltage of the initialization power Vint (or the initialization power voltage) to the anode electrode of the light emitting element LD. That is, the seventh transistor M7 may be an anode initialization transistor that initializes the anode electrode of the light emitting element LD.

Here, the third scan line SLi+1 may be the same scan line as the second scan line of a pixel positioned in a next row. That is, the gate electrode of the seventh transistor M7 may be connected to the second scan line of the pixel of the next row, and the third scan signal GI[i+1] provided to the gate electrode of the seventh transistor M7 may be the same as the second scan signal provided by the second scan line of the pixel positioned in the next row. Accordingly, the third scan signal GI[i+1] provided to the third scan line SLi+1 may be a signal having substantially the same waveform as the second scan signal GI[i] provided to the second scan line SLi−1, but is not limited.

In addition, the voltage of the initialization power Vint may be set to a voltage lower than the data signal. That is, the voltage of the initialization power Vint may be set to be equal to or less than a lowest voltage of the data signal.

The seventh transistor M7 may be disposed in an area different from that of the first to sixth transistors M1 to M6. For example, the seventh transistor M7 may be positioned in a different pixel row (or a different pixel area) from the first to sixth transistors M1 to M6. This will be described later in detail with reference to FIGS. 9A to 11.

The storage capacitor Cst may be connected between the first power ELVDD and the first node N1. The storage capacitor Cst may store a voltage corresponding to the data signal and a threshold voltage of the first transistor M1.

The first electrode (the anode electrode) of the light emitting element LD may be connected to the first transistor M1 through the sixth transistor M6, and a second electrode (a cathode electrode) of the light emitting element LD may be connected to the second power ELVSS. The light emitting element LD generates light of a predetermined luminance corresponding to the current amount supplied from the first transistor M1. A voltage value of the first power ELVDD may be set to be higher than a voltage value of the second power ELVSS so that a current may flow to the light emitting element LD.

The light emitting element LD may be, for example, an organic light emitting diode. The light emitting element LD may emit light of one of red, green, and blue. However, the disclosure is not limited.

Meanwhile, a structure of the pixel PXL is not limited to the embodiment shown in FIG. 2. For example, a pixel circuit of various structures which are currently known may be applied to the pixel PXL.

Figure 2B:
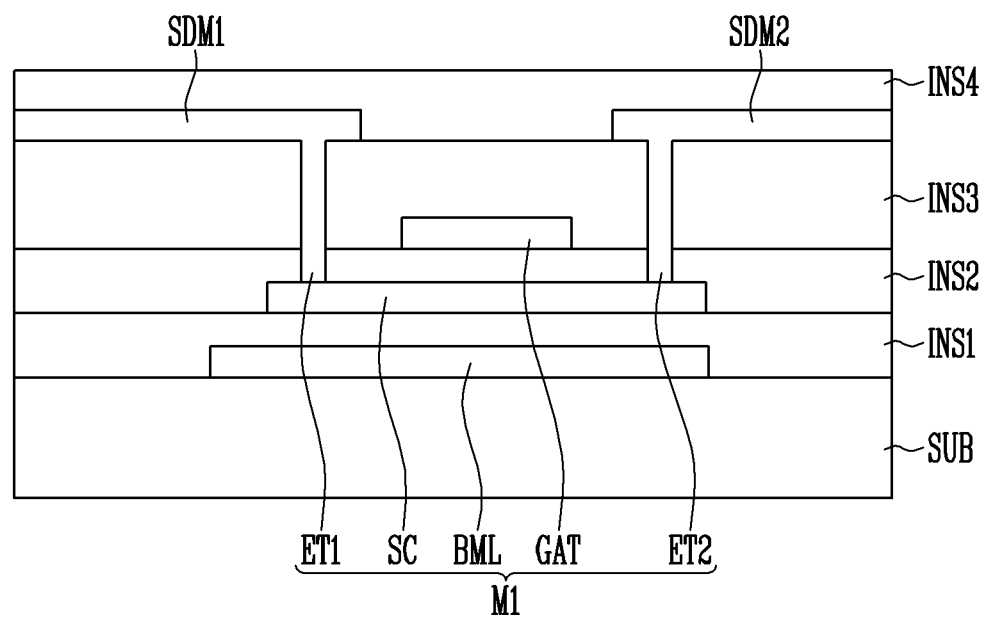
FIG. 2B is a cross-sectional view illustrating an example of a first transistor included in the pixel of FIG. 2A.

FIG. 2B is a cross-sectional view illustrating an example of the first transistor M1 included in the pixel of FIG. 2A.

Referring to FIGS. 2A and 2B, the first transistor M1 (or the pixel PXL) may include a base layer SUB, a plurality of insulating layers INS1, INS2, INS3, and INS4, a semiconductor pattern SC, and a plurality of conductive patterns GAT, BML, SDM1, and SDM2.

The base layer SUB may provide a space in which each of configurations of the pixel PXL is disposed. The base layer SUB may be a rigid substrate or a flexible substrate, and a material or a physical property of the base layer SUB is not particularly.

Although not shown in the drawing, a buffer layer may be further disposed on the base layer SUB. The buffer layer may prevent an impurity from being diffused into a circuit element.

The insulating layers include a first insulating layer INS1, a second insulating layer INS2, a third insulating layer INS3, and a fourth insulating layer INS4, and the first insulating layer INS1, the second insulating layer INS2, the third insulating layer INS3, and the fourth insulating layer INS4 may be sequentially disposed on the base layer SUB.

Each of the insulating layers INS1, INS2, INS3, and INS4 may be comprised of a single layer or multiple layers, and may include at least one inorganic insulating material and/or an organic insulating material. For example, each of the insulating layers INS1, INS2, INS3, INS4 may include various types of organic/inorganic insulating materials which are currently known, including SiNx and SiOx, and a configuration material of each of the insulating layers INS1, INS2, INS3, and INS4 is not particularly. In addition, the insulating layers INS1, INS2, INS3, and INS4 may include different insulating materials, or at least some of the insulating layers INS1, INS2, INS3, and INS4 may include the same insulating material.

The conductive patterns may include a gate electrode GAT, a body electrode BML, a first metal pattern SDM1, and a second metal pattern SDM2.

Each of the gate electrode GAT, the body electrode BML, the first metal pattern SDM1, and the second metal pattern SDM2 may include at least one material of at least one conductive material, for example, Ag, Mg, Al, Pt, Pd, Au, Ni, Nd, Ir, Cr, or Ti, and a metal such as an alloy thereof, but is not limited.

The body electrode BML may be disposed on the base layer SUB. As described above, when the buffer layer is disposed on the base layer SUB, the body electrode BML may be disposed on the buffer layer.

A control signal may be transferred to the body electrode BML and the body electrode may perform adjusting a channel region of the semiconductor pattern SC together with the gate electrode GAT. For example, the same signal as that provided to any one of the gate electrode GAT, the first metal pattern SDM1, and the second metal pattern SDM2 may be supplied to the body electrode BML. That is, the body electrode BML may be synchronized with any one of the gate electrode GAT, the first metal pattern SDM1, and the second metal pattern SDM2. As another example, the body electrode BML may receive the control signal through a separate control line. In addition, according to an embodiment, the first transistor M1 may not include the body electrode BML.

The semiconductor pattern SC may be disposed on the first insulating layer INS1. For example, the semiconductor pattern SC may be disposed between the first insulating layer INS1 and the second insulating layer INS2. The semiconductor pattern SC may include a first region that is in contact with a first transistor electrode ET1, a second region that is in contact with a second transistor electrode ET2, and a channel region positioned between the first and second regions. One of the first and second regions may be a source region and the other may be a drain region.

The semiconductor pattern SC may be a semiconductor pattern formed of polysilicon, amorphous silicon, low temperature poly-silicon (LTPS), or the like. The channel region of the semiconductor pattern SC may be an intrinsic semiconductor as a semiconductor pattern that is not doped with an impurity, and the first and second regions of the semiconductor pattern SC may be semiconductor patterns doped with a predetermined impurity respectively.

The semiconductor pattern SC may be disposed to overlap the body electrode BML, and the body electrode BML may overlap at least one region of the semiconductor pattern SC.

The gate electrode GAT may be disposed on the second insulating layer INS2. That is, the gate electrode GAT may be disposed between the second insulating layer INS2 and the third insulating layer INS3. The gate electrode GAT may overlap at least one region of the semiconductor pattern SC. FIG. 2B shows that the first transistor M1 includes only one gate electrode GAT, but the disclosure is not limited, and the first transistor M1 may include a plurality of gate electrodes. In addition, the gate electrodes of the transistors from M2 to M7 except the first transistor M1 may be disposed on a layer different from that of the gate electrode GAT of the first transistor M1.

The gate electrode GAT, the semiconductor pattern SC, the body electrode BML, and the first and second transistor electrodes ET1 and ET2 may configure the first transistor M1.

The first metal pattern SDM1 and the second metal pattern SDM2 may be disposed on the third insulating layer INS3.

The first metal pattern SDM1 may be in contact with one region of the semiconductor pattern SC through a contact hole passing through the second and third insulating layers INS2 and INS3, and may configure the first transistor electrode ET1 of the first transistor M1.

The second metal pattern SDM2 may be in contact with another region of the semiconductor pattern SC through a contact hole passing through the second and third insulating layers INS2 and INS3, and may be the second transistor electrode ET2 of the first transistor M1.

Figure 3A:
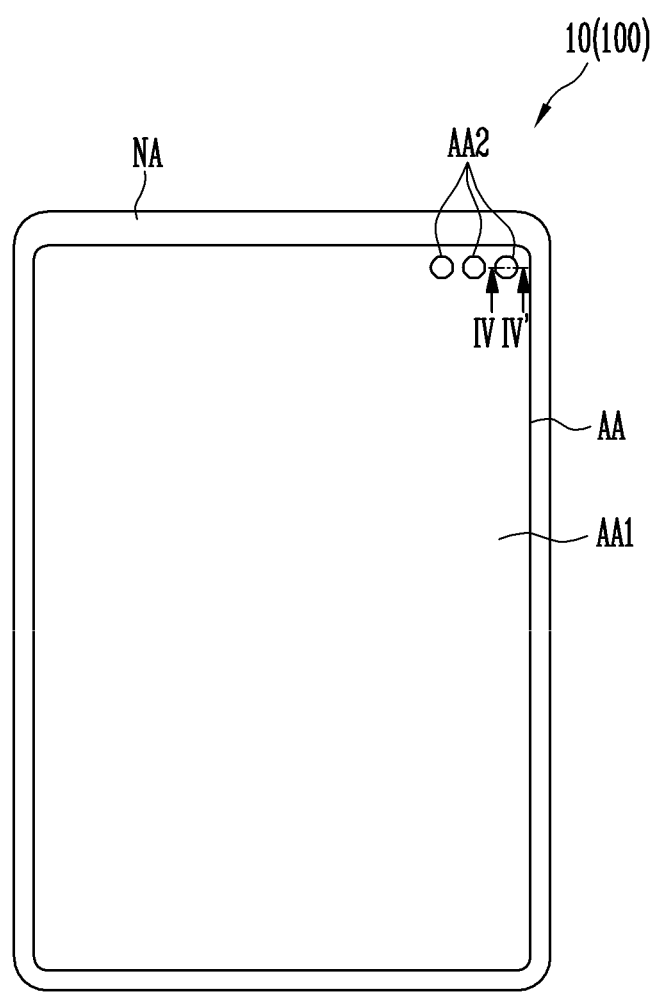

FIGS. 3A and 3B are plan views of the display device according to an embodiment of the disclosure. In particular, FIGS. 3A and 3B show a front surface of the display device 10.

The entire or at least some of the display device 10 may have a flexible portion. For example, the display device 10 may have the flexible portion in the entire area, or may have the flexible portion in a flexible area.

As depicted in FIG. 3A, the display panel 100 may be disposed on the front surface of the display device 10. The display panel 100 may include a display area AA and a non-display area NA which surrounds the display area AA.

The display area AA may be an area in which a plurality of pixels PXL (i.e., FIG. 1) is disposed and may be referred to as an active area. In various embodiments of the present disclosure, the display area AA may be disposed in a large screen to occupy most of the front surface of the display device 10.

The non-display area NA may be an area disposed around the display area AA and may be provided at a front surface edge of the display device 10 as shown in FIG. 3A. The non-display area NA may be referred to as a non-active area or a bezel area. The non-display area NA may comprehensively refer to a remaining area except for the display area AA.

The non-display area NA may include driving elements, lines, and various dummy areas for applying a driving signal to the display area AA. For example, in the non-display area NA, the scan driver 210, the data driver 220, the emission driver 230, the timing controller 240, and various lines connected to the pixels PXL, which are shown in FIG. 1, may be disposed to drive the pixels which are disposed in the display area AA.

In another embodiment, the display area AA may be disposed on the entire front surface of the display device 10. As the display area AA is disposed on the entire front surface of the display device 10, the non-display area NA may not be disposed or may be disposed in a very small portion on the front surface. In such an embodiment, the display area AA may be in contact with a side edge of the display device 10 or may be disposed at a distance less than about 1 mm from the side edge.

FIG. 3A shows an embodiment in which the display area AA is disposed only on the front surface of the display device 10, but the disclosure is not limited. That is, in various embodiments, the display area AA may be disposed in at least one area of the side edge of the display device 10 or at least one area of a rear surface thereof. At least a portion of the display areas AA disposed on a plurality of surfaces of the display device 10 may be connected to or separated from each other.

In various embodiments of the present disclosure, the display device 10 may include a plurality of sensors (not shown) disposed to overlap the display area AA. The sensors may be disposed under the pixels and/or the lines disposed in the display area AA, and may be concealed with respect to the front surface. When the sensors are disposed under the pixels PXL and/or the lines disposed in the display area AA and overlap the display area AA as described above, a wider display area may be secured.

An area that does not overlap the sensors may be defined as a first display area AA1 and an area that overlaps the sensors may be defined as a second display area AA2 (or a sensor area). However, in various embodiments, the second display area AA2 may be set to have an area wider than the area overlapping the sensors. For example, the second display area AA2 may be widely formed at one portion of the display device 10 as shown in FIG. 3B. In such an embodiment, a width of the first display area AA1 from an upper edge of the display device 10 to an upper edge of the second display area AA2 may be between about 5 mm and about 8 mm. However, in other embodiments, the width may be less than about 5 mm or greater than about 8 mm.

The second display area AA2 may be positioned inside the display area AA and may be surrounded by the first display area AA1. In FIG. 3A, the second display area AA2 has a substantially circular shape on a plane, but is not limited. That is, as shown in FIG. 3B, the second display area AA2 may have various shapes such as a polygon such as a quadrangle and an ellipse.

In addition, in FIGS. 3A and 3B, at least one second display area AA2 is disposed only at an upper end portion of the front surface of the display device 10, but the disclosure is not limited. That is, in various embodiments, a plurality of second display areas AA2 may be provided, and may be disposed adjacent to each other or distributed in the display area AA. For example, when the display area AA is formed on the side edge and/or the rear surface of the display device 10, a portion of the second display areas AA2 may be disposed in the display area AA of the side edge and/or in the display area AA of the rear surface.

The sensors disposed to overlap the second display area AA2 may be optical sensors. The sensors may include, for example, a fingerprint sensor, an image sensor, a camera, a strobe, an optical sensor, an illuminance sensor, a proximity sensor, an RGB sensor, an infrared sensor, and the like. However, the sensors are not limited to the optical sensors, and may include various sensors such as an ultrasonic sensor, a microphone, an environment sensor (for example, a barometer, a hygrometer, a thermometer, a radiation sensing sensor, a heat sensing sensor, and the like), and a chemical sensor (a gas sensing sensor, a dust sensing sensor, an odor sensing sensor, and the like).

In an embodiment, as shown in FIG. 3A, one second display area AA2 may overlap one sensor. For example, one of the second display areas AA2 may overlap the camera, another may overlap the proximity sensor, and the other may overlap the illumination sensor.

However, in another embodiment, as shown in FIG. 3B, one second display area AA2 may overlap a plurality of sensors. For example, one of the second display areas AA2 may overlap the camera and the proximity sensor disposed side by side, and the other may overlap the illumination sensor.

The second display area AA2 may transmit a signal (for example, an optical signal) input to the sensors. In order to improve transmittance of the signal, the pixels may be disposed in the second display area AA2 at a density lower than that of the first display area AA1. When the pixels are disposed at a low density, a physical and/or optical aperture may be formed between each of the pixels, and thus the signal may be more effectively transmitted. That is, transmittance of the second display area AA2 may be greater than that of the first display area AA1. A disposition density of the pixels in the first display area AA1 and the second display area AA2 will be described later in more detail with reference to the accompanying drawing.

Figure 4:
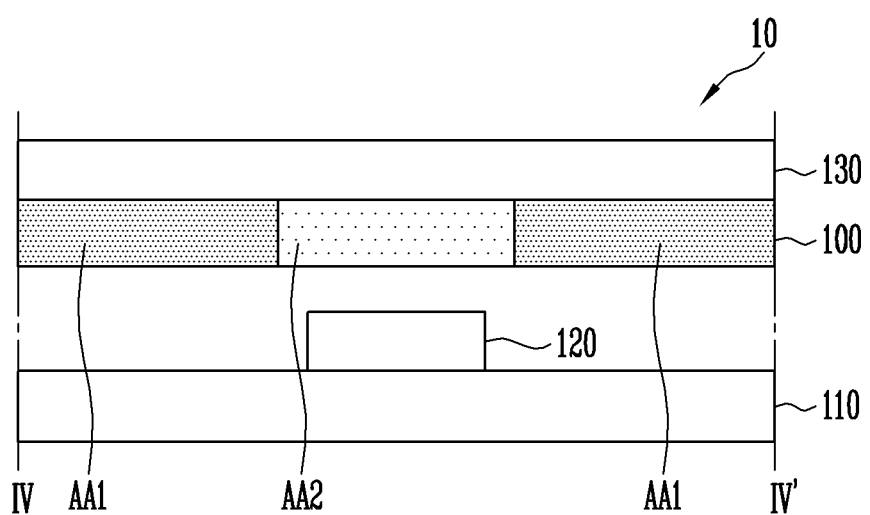
FIG. 4 is a cross-sectional view taken along a line IV-IV' of FIG. 3A.

FIG. 4 is a schematic cross-sectional view taken along a line IV-IV' of FIG. 3A.

Referring to FIG. 4, the display device 10 may include a substrate 110, at least one sensor 120, a display panel 100, and a window 130. The substrate 110, the sensor 120, the display panel 100, and the window 130 may form a structure stacked in a vertical direction.

The substrate 110 may support the display panel 100 and the sensor 120. In an embodiment, the substrate 110 may be a bracket, a lower cover, or the like, and may include a plastic or metal material. The substrate 110 may form an appearance of the rear surface of the display device 10 and may protect components inside an electronic device from external stress.

The sensor 120 may be disposed on the substrate 110 in a surface mount technology (SMT). The sensor 120 may be disposed between the substrate 110 and the display panel 100. The sensor 120 may be disposed to overlap at least one area of the display panel 100, for example, the second display area AA2.

The display panel 100 may be a flat panel display panel or a flexible display panel. For example, the display panel 100 may include a rigid base layer formed of glass, plastic, or the like, or a flexibility base layer such as a plastic film. The display panel 100 may display an image using a pixel element layer and a light emitting layer disposed on the base layer. As described with reference to FIG. 2A, the pixels PXL may include the pixel circuit PC formed in the circuit element layer and the light emitting element LD formed in the light emitting element layer. As described above, the light emitting element may be the organic light emitting diode, but the light emitting element is not limited to the organic light emitting diode. For example, the light emitting element may be an inorganic light emitting element including an inorganic light emitting material or a light emitting element (quantum dot light emitting element) that emits light by changing a wavelength of light emitted using a quantum dot.

The display panel 100 may include the first display area AA1 and the second display area AA2 overlapping the sensor 120 described with reference to FIGS. 3A and 3B. The pixels may be disposed in the first display area AA1 and the second display area AA2.

A pixel disposition structure in each of the display areas AA1 and AA2 may be different from each other. In an embodiment, the pixels PXL may be disposed at different densities in the first display area AA1 and the second display area AA2. For example, the pixels PXL may be disposed at a first density in the first display area AA1 and the pixels PXL may be disposed at a second density in the second display area AA2. The second density may be set to be smaller than the first density.

That is, the area in which the pixels are disposed relative to the entire area in the second display area AA2 may be smaller than that in the first display area AA1. As the pixels are disposed at a relatively low density in the second display area AA2, the transmittance of the second display area AA2 may be greater than that of the first display area AA1.

As the density of the pixels in the second display area AA2 is smaller than that in the first display area AA1, an image displayed in the second display area AA2 may be visually recognized darker (that is, at a lower luminance) relatively to an image displayed in the first display area AA1. In order to solve such a problem, the pixels PXL disposed in the second display area AA2 may be controlled to emit light at a brighter luminance with respect to the same image data.

Meanwhile, in another embodiment, the first display area AA1 and the second display area AA2 may have the same pixel density and may be configured to have different transmittances instead. For example, the pixels PXL disposed in the first display area AA1 may be configured of a material having a first transmittance, and the pixels PXL disposed in the second display area AA2 may be configured of a material having a second transmittance higher than the first transmittance.

Alternatively, the circuit elements of the pixels disposed in the second display area AA2 and the lines connected to the circuit elements may be formed to be densely disposed or have the narrow area than the circuit elements of the pixels disposed in the first display area AA1 and the lines connected to the circuit elements. That is, a size of the pixels PXL disposed in the second display area AA2 may be formed to be smaller than a size of the pixels PXL disposed in the first display area AA1. Accordingly, distances between the circuit elements, between the lines, and between the circuit elements and the lines in the second display area AA2 may be widened, and as a result, the transmittance of the second display area AA2 may be improved.

The window 130 may be disposed at the outermost portion of the display device 10. The window 130 may be made out of a glass material or a synthetic resin material. The window 130 may be comprised of a transmissive material. The window 130 may be provided to protect components disposed under the window 130.

Figure 5:
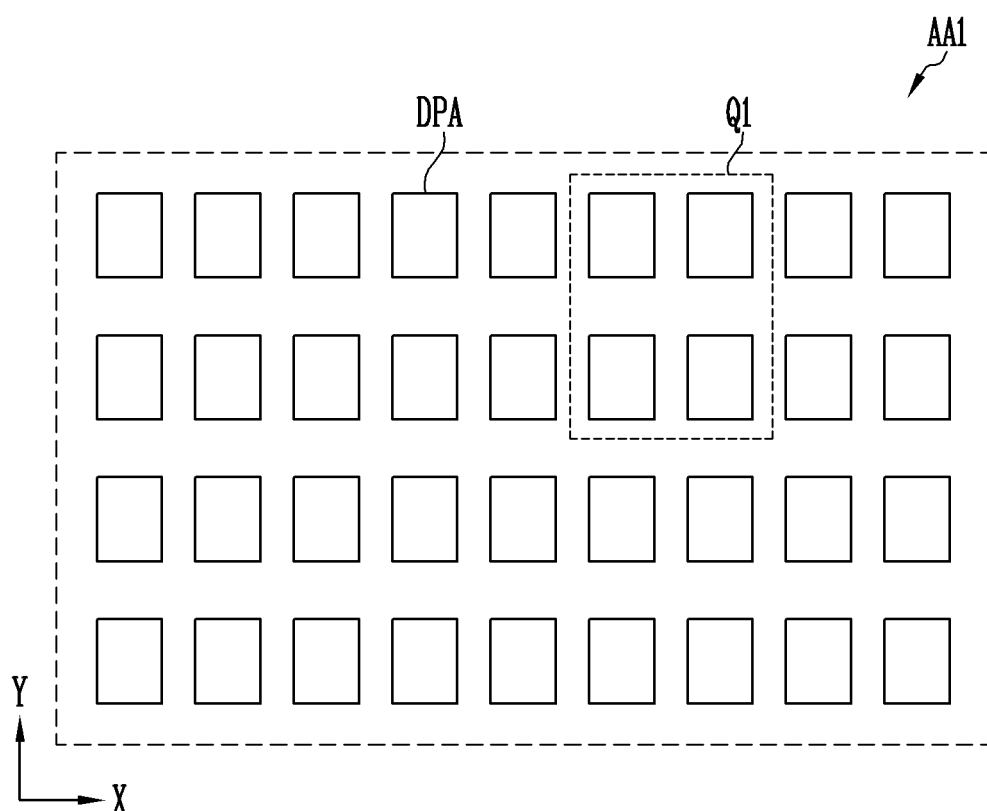
FIG. 5 is a plan view illustrating a first display area according to an embodiment.
Figure 6:
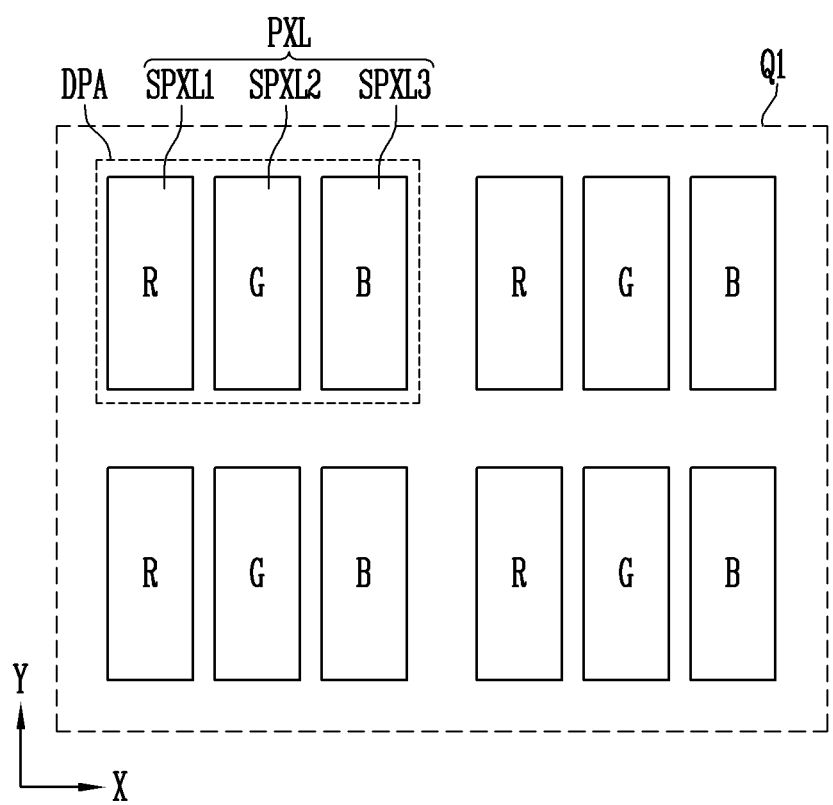
FIG. 6 is an enlarged view according to an embodiment of a region Q1 of FIG. 5.
Figure 7:
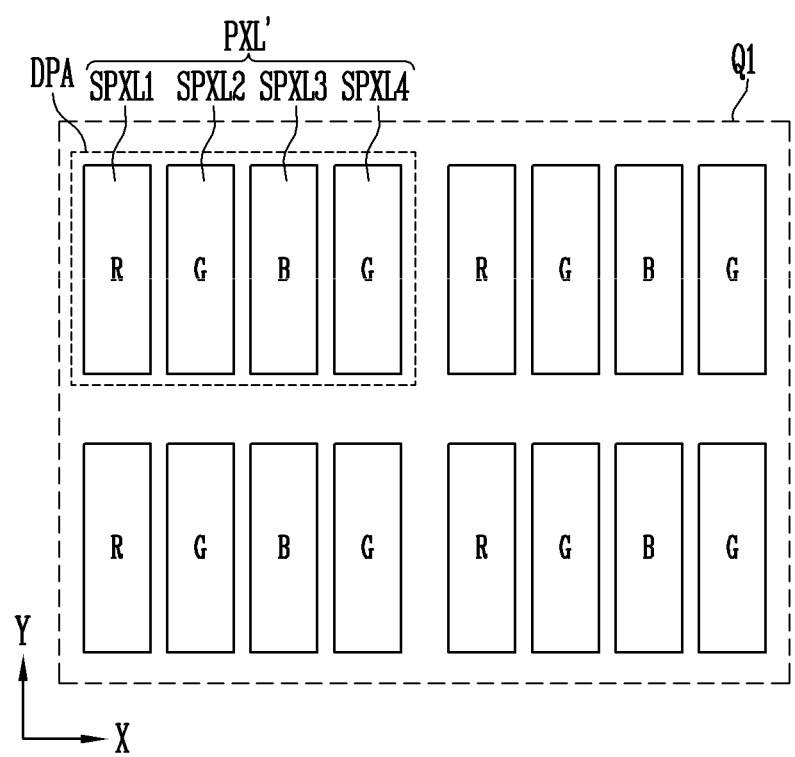
FIG. 7 is an enlarged view according to another embodiment of the region Q1 of FIG. 5.

FIG. 5 is a plan view schematically illustrating the first display area according to an embodiment. FIG. 6 is an enlarged view according to an embodiment of a region Q1 of FIG. 5. FIG. 7 is an enlarged view according to another embodiment of the region Q1 of FIG. 5.

Referring to FIGS. 5 to 7, the first display area AA1 may include a plurality of display pixel areas DPA. The display pixel areas DPA may be arranged in a predetermined number along a first direction X and a second direction Y according to resolution of the display device 10. The first direction X and the second direction Y may be substantially perpendicular to each other.

Each display pixel area DPA may include at least one pixel PXL as shown in FIG. 6 and PXL' as shown in FIG. 7. Each of the pixels PXL and PXL' may include a plurality of sub pixels (or sub pixel areas) which emit light of the same or different colors. For example, the sub pixels may emit light of red R, green G, and/or blue B. However, the disclosure is not limited, and the sub pixels included in the display pixel area DPA may emit light of various colors as long as the sub pixels may implement white light by a combination.

Each of the sub pixels may include a configuration of the pixel circuit PC and the light emitting element LD included in the pixel PXL described with reference to FIG. 2A. For example, the pixel PXL of FIG. 2A may mean a circuit configuration of one sub pixel.

In an embodiment, the pixel PXL may include a first sub pixel SPX1, a second pixel SPX2, and a third sub pixel SPX3 arranged in the first direction X as shown in FIG. 6. The first to third sub pixels SPX1, SPX2, and SPX3 may be disposed in a stripe pattern. For example, the first sub pixel SPX1 (or a first sub pixel area) may emit light of red R, the second sub pixel SPX2 (or a second sub pixel area) may emit light of green G, and the third sub pixel SPX3 (or a third sub pixel area) may emit light of blue B.

In another embodiment, the pixel PXL' may include a first sub pixel SPX1, a second sub pixel SPX2, a third sub pixel SPX3, and a fourth sub pixel SPX4 arranged in the first direction X as shown in FIG. 7. The first to fourth sub pixels SPX1, SPX2, SPX3, and SPX4 may be disposed in a pentile pattern. For example, the first sub pixel SPX1 may emit light of red R, the second sub pixel SPX2 may emit light of green G, the third sub pixel SPX3 may emit light of blue B, and the fourth sub pixel SPX4 (or a fourth sub pixel area) may emit light of green G.

Meanwhile, in FIGS. 6 and 7, each of the sub pixels has a rectangular shape, but the disclosure is not limited. That is, in various embodiments, each of the sub pixels may have various shapes such as a square, a rhombus, a hexagon, and an octagon. In addition, in FIGS. 6 and 7, each of the sub pixels has the same area as each other, but the disclosure is not limited thereto. That is, in various embodiments, sub pixels emitting light of an arbitrary color (for example, the light of red R and/or the light of blue B) among each of the sub pixels may have the area larger than areas of the sub pixels emitting light of another color (for example, the light of green G).

Figure 8:
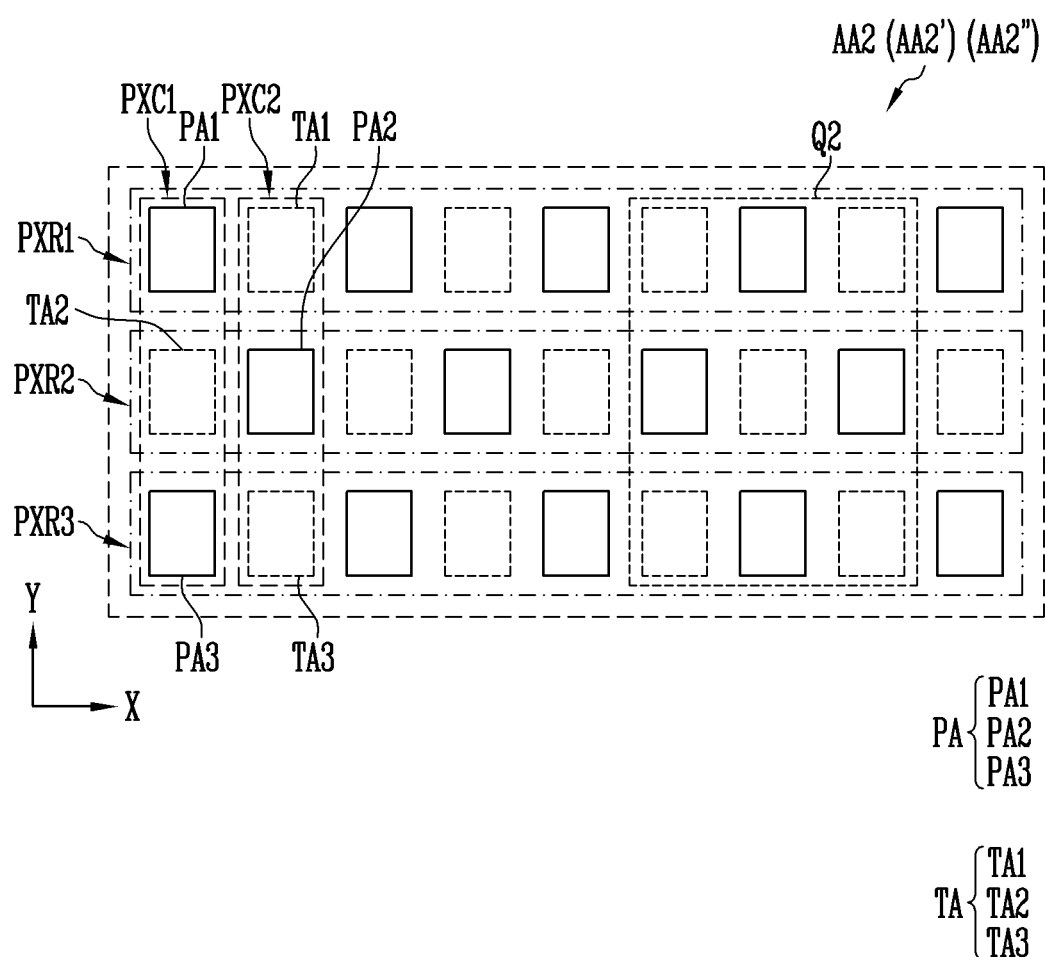
FIG. 8 is a plan view schematically illustrating a second display area according to an embodiment.

FIG. 8 is a plan view schematically illustrating the second display area AA2 according to an embodiment.

Referring to FIG. 8, the second display area AA2 may include a pixel area PA and a transmission area TA. In an embodiment, the pixel area PA and the transmission area TA may be alternately arranged along the first direction X and the second direction Y.

The pixel area PA may include a first pixel area PA1, a second pixel area PA2, and a third pixel area PA3, and the transmission area TA may include a first transmission area TA1, a second transmission area TA2, and a third transmission area TA3.

The first pixel area PA1 and the first transmission area TA1 may be alternately arranged along the first direction X to form a first pixel row PXR1, the second pixel area PA2 and the second transmission area TA2 may be alternately arranged along the first direction X to form a second pixel row PXR2, and the third pixel area PA3 and the third transmission area TA3 may be alternately arranged along the first direction X to form a third pixel row PXR3. The first pixel row PXR1, the second pixel row PXR2, and the third pixel row PXR3 may be sequentially arranged along the second direction Y, and thus, the first pixel area PA1, the second pixel area PA2, and the third pixel area PA3 may be positioned in different pixel rows respectively.

In addition, the second display area AA2 may include a plurality of pixel columns. For example, the second display area AA2 may include a first pixel column PXC1 comprised of the first pixel area PA1, the second transmission area TA2, and the third pixel area PA3 sequentially arranged along the second direction Y, and a second pixel column PXC2 which is adjacent to the first pixel column PXC1 is comprised of the first transmission area TA1, the second pixel area PA2, and the third transmission area TA3 sequentially arranged along the second direction Y. The first pixel column PXC1 and the second pixel column PXC2 may be alternately arranged along the first direction X. Accordingly, the first pixel area PA1 included in the first pixel column PXC1 and the second pixel area PA2 included in the second pixel column PXC2 may be positioned in different pixel columns.

Each of the pixel areas PA1, PA2, and PA3 may include the pixels PXL and PXL' (or the sub pixels SPXL1, SPXL2, SPXL3, and SPXL4) described with reference to FIGS. 6 and 7. Each of the pixel areas PA1, PA2, and PA3 may include a plurality of pixels PXL and PXL', but is not limited. Each of the pixel areas PA1, PA2, and PA3 may include only one pixel.

Figure 9A:
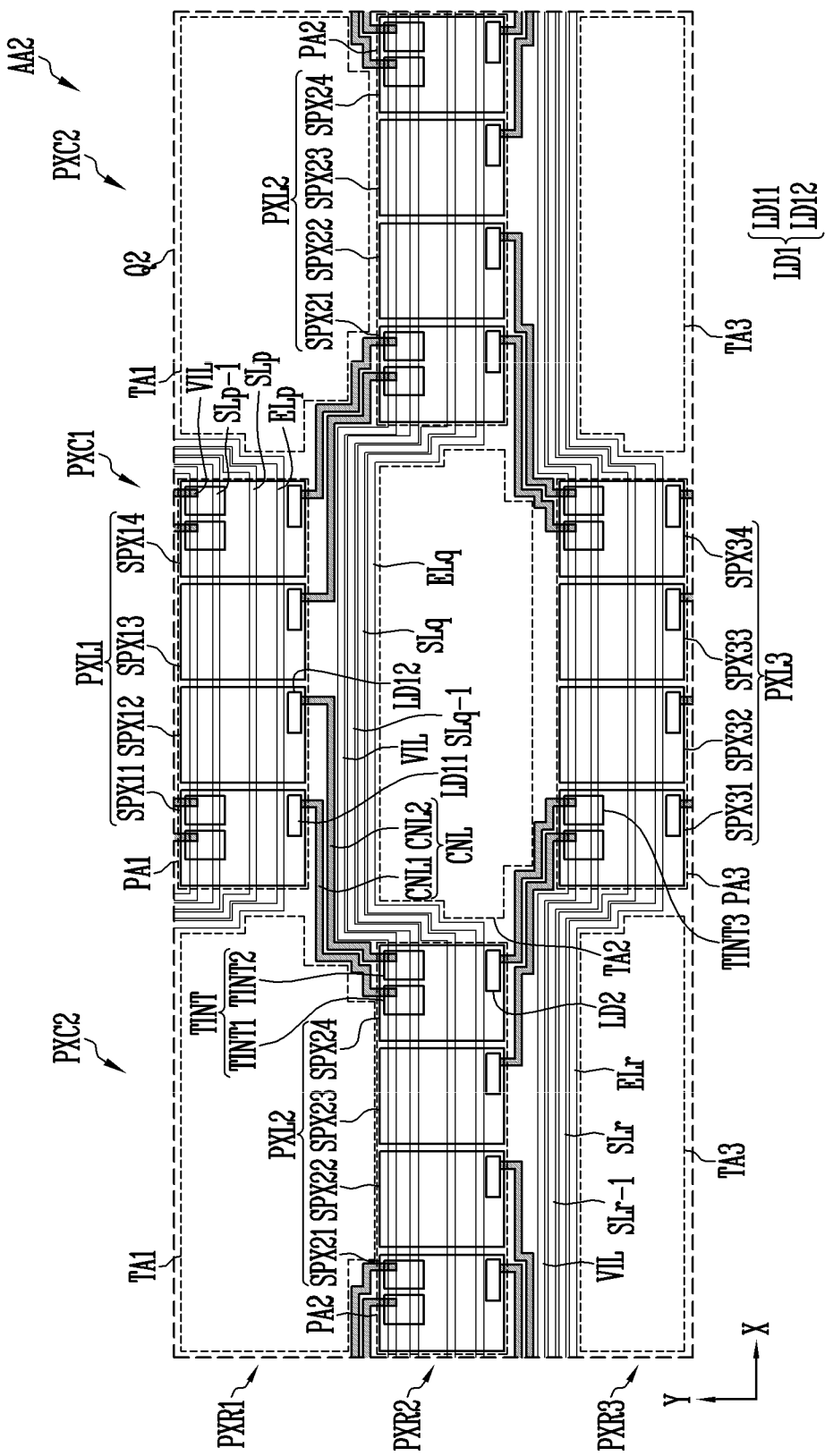
FIG. 9A is an enlarged view according to an embodiment of a region Q2 of FIG. 8.
Figure 9B:
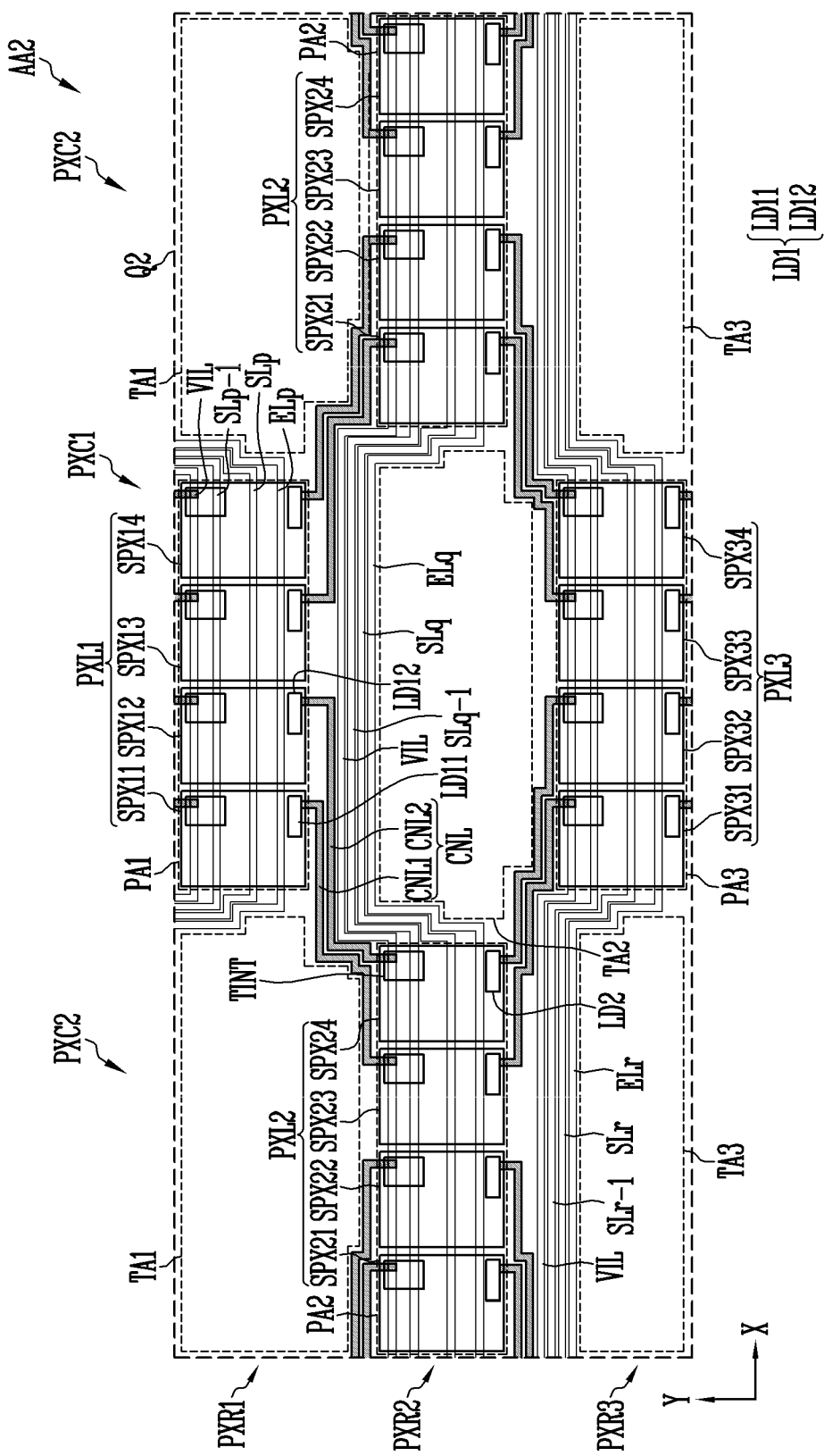
FIG. 9B is an enlarged view according to another embodiment of the region Q2 of FIG. 8.

FIG. 9A is an enlarged view according to an embodiment of a region Q2 of FIG. 8. FIG. 9B is an enlarged view according to another embodiment of the region Q2 of FIG. 8.

Hereinafter, a disposition structure of pixels and signal lines included in the second display area AA2 will be described in detail with reference to FIGS. 9A and 9B.

Referring to FIGS. 8, 9A, and 9B, the second display area AA2 may include the first pixel area PA1, the second pixel area PA2, and the third pixel area PA3. As described above, the first pixel area PA1, the second pixel area PA2, and the third pixel area PA3 may be positioned in different pixel rows PXR1, PXR2, and PXR3.

A first pixel PXL1, a second pixel PXL2, and a third pixel PXL3 may be disposed in the second display area AA2. In addition, a plurality of signal lines SLp−1, SLp, ELp, SLq−1, SLq, ELq, SLr−1, SLr, and ELr that transfer driving signals for driving each of the pixels PXL1, PXL2, and PXL3, and initialization power lines VIL may be disposed in the second display area AA2. The second display area AA2 may include the first transmission area TA1, the second transmission area TA2, and the third transmission area TA3 arranged between each of the pixel areas PA1, PA2, and PA3.

Each of the pixel areas PA1, PA2, and PA3 may include a plurality of sub pixels (or sub pixel areas) that emit light of the same or different colors. For example, the first pixel area PA1 may include a first sub pixel SPX11 (or a first sub pixel area), a second sub pixel SPX12 (or a second sub pixel area), a third sub pixel SPX13 (or a third sub pixel area), and a fourth sub pixel SPX14 (or a fourth sub pixel area) arranged along the first direction X. In addition, the second pixel area PA2 may include first to fourth sub pixels SPX21, SPX22, SPX23, and SPX24 (or first, second, third, and fourth sub pixel areas) arranged along the first direction X, and the third pixel area PA3 may include first to fourth sub pixels SPX31 SPX32, SPX33, and SPX34 (or first, second, third, and fourth sub pixel areas) arranged along the first direction X.

The first to fourth sub pixels SPX11 to SPX14 of the first pixel area PA1 may emit light of different colors. The first to fourth sub pixels SPX11 to SPX14 may be disposed in a pentile pattern. For example, the first sub pixel SPX11 may emit red light, the second sub pixel SPX12 may emit green light, the third sub pixel SPX13 may emit blue light, and the fourth sub pixel SPX14 may emit green light. However, the disclosure is not limited, and the first to fourth sub pixels SPX11 to SPX14 may emit light of various colors as long as the first to fourth sub pixels SPX11 to SPX14 may implement white light by a combination.

The first to fourth sub pixels SPX21 to SPX24 included in the second pixel area PA2 and the first to fourth sub pixels SPX31 to SPX34 included in the third pixel area PA3 may also emit light of different colors similarly to the first to fourth sub pixels SPX11 to SPX14 of the pixel area PA1.

A configuration of the sub pixels included in each of the pixel areas PA1, PA2, and PA3 is not limited, and may include only three sub pixels emitting light of different colors or may further include a white sub pixel emitting white light.

Figure 10A:
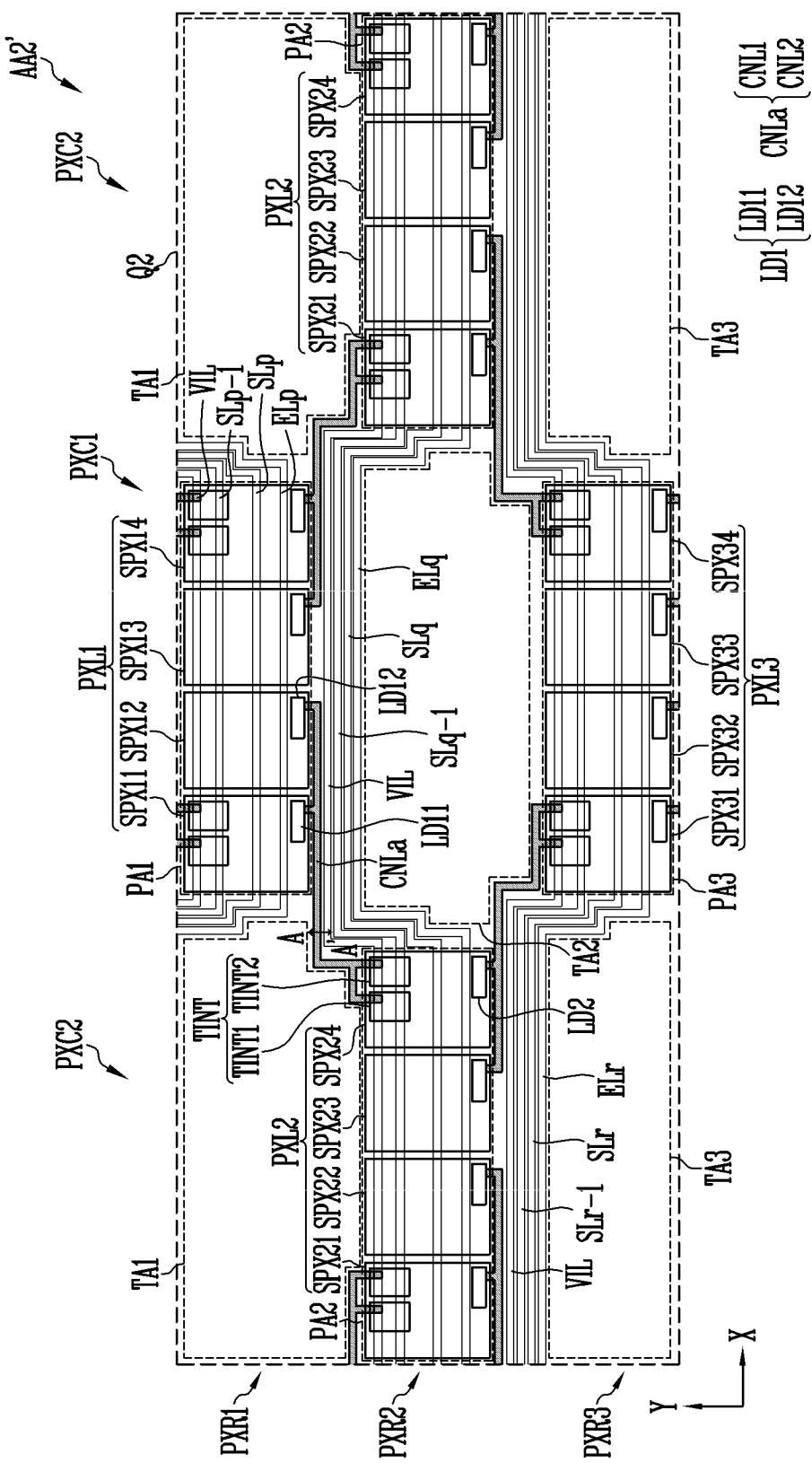
FIG. 10A is an enlarged view according to still another embodiment of the region Q2 of FIG. 8.

Meanwhile, for convenience of description, FIGS. 9A, 9B, and 10A illustrate a structure in which each of the pixel areas PA1, PA2, and PA3 includes one pixel PXL1, PXL2, and PXL3, but the current disclosure is not limited. For example, each of the pixel areas PA1, PA2, and PA3 may include a plurality of pixels. This will be described later in detail with reference to FIG. 11.

The first transmission area TA1 may be defined between the first pixel areas PA1 arranged along the first direction X, the second transmission area TA2 may be defined between the second pixel areas PA2 arranged along the first direction X, and the third transmission area TA3 may be defined between the third pixel areas PA3 arranged along the first direction X as shown in FIG. 8.

The plurality of signal lines SLp−1, SLp, ELp, SLq−1, SLq, ELq, SLr−1, SLr, and ELr may include initialization lines SLp−1, SLq−1, and SLr−1 that provide an initialization signal, scan lines SLp, SLq, and SLr that provide a scan signal, and emission control lines ELp, ELq, and ELr that provide an emission control signal. Each of the signal lines SLp−1, SLp, ELp, SLq−1, SLq, ELq, SLr−1, SLr, and ELr and the initialization power lines VIL may be disposed to pass through each of the pixel areas PA1, PA2, and PA3.

The initialization lines SLp−1, SLq−1, and SLr−1 may be signal lines corresponding to the second scan line SLi−1 described with reference to FIG. 2A, the scan lines SLp, SLq, and SLr may be signal lines corresponding to the first scan line SLi described with reference to FIG. 2A, and the emission control lines ELp, ELq, and ELr may be signal lines corresponding to the emission control line ELi described with reference to FIG. 2A. The initialization power line VIL may be connected to the initialization power Vint (i.e., FIG. 2A) to transfer the initialization power voltage to each of the pixels PXL1, PXL2, and PXL3.

Meanwhile, a gate electrode of an initialization transistor TINT may be connected to the initialization lines SLp−1, SLq−1, and SLr−1. For example, gate electrodes of initialization transistors TINT1 and TINT2 connected to first light emitting elements LD1 of the first pixel PXL1 may be connected to a second initialization line SLq−1 that provides an initialization signal to the second pixel PXL2. Similarly, a gate electrode of an initialization transistor TINT3 connected to light emitting elements LD2 of the second pixel PXL2 may be connected to a third initialization line SLr−1 that provides an initialization signal to the third pixel PXL3.

In an embodiment, the signal lines SLp−1, SLp, ELp, SLq−1, SLq, ELq, SLr−1, SLr, and ELr and the initialization power line VIL may be disposed to bypass the transmission areas TA1, TA2, and TA3 positioned between each of the pixel areas PA1, PA2, and PA3.

For example, the signal lines SLq−1, SLq, and ELq passing through the second pixel area PA2 and the initialization power line VIL may be disposed adjacent to the first pixel area PA1 in an upper direction (for example, the second direction Y) to bypass the second transmission area TA2 adjacent in the first direction X. In other words, the second transmission area TA2 may be an area formed by bypassing of the signal lines SLq−1, SLq, and ELq and the initialization power line VIL disposed in the adjacent second pixel area PA2. However, a disposition of the signal lines SLq−1, SLq, and ELq and the initialization power line VIL disposed in the second pixel area PA2 is not limited, and may be disposed adjacent to the third pixel area PA3 in a lower direction (for example, a direction opposite to the second direction Y) to bypass the second transmission area TA2.

In the first pixel area PA1, a first initialization line SLp−1, a first scan line SLp, a first emission control line ELp, and the initialization power line VIL may be disposed, and thus various signals may be provided to the first pixel PXL1. In addition, the first light emitting elements LD1 that emit light of different colors in correspondence with the respective sub pixels SPX11 to SPX14 may be disposed in the first pixel area PA1.

The first initialization line SLp-1 may be connected to the gate electrode of the fourth transistor M4 (shown in FIG. 2A) disposed in the first pixel area PA1 to provide a gate initialization signal. The first scan line SLp may be connected to the gate electrodes of the second transistor M2 (shown in FIG. 2A) and the third transistor M3 (shown in FIG. 2A) to provide the scan signal. The first emission control line ELp may be connected to the gate electrodes of the fifth transistor M5 (shown in FIG. 2A) and the sixth transistor M6 (shown in FIG. 2A) to provide the emission control signal.

Meanwhile, the initialization transistor TINT of the first pixel PXL1 may have the same configuration as the seventh transistor M7 described with reference to FIG. 2A. The initialization transistor TINT may be disposed in a pixel area (for example, the second pixel area PA2) different from that of the first light emitting element LD1 disposed in the first pixel area PA1. In addition, the initialization transistor TINT may be disposed in a pixel area different from that of the first to sixth transistors M1 to M6 disposed in the first pixel area PA1. For example, the first light emitting element LD1 (or the first to sixth transistors M1 to M6) of the first pixel PXL1 may be disposed in a region where the first pixel row PXR1 and the first pixel column PXC1 cross each other, and the initialization transistor TINT of the first pixel PXL1 may be disposed in a region where the second pixel row PXR2 and the second pixel column PXC2 cross each other. That is, the initialization transistor TINT may be disposed in a pixel row and a pixel column different from those of the first light emitting element LD1 (or the first to sixth transistors M1 to M6).

In other words, the first light emitting elements LD1 and the first to sixth transistors M1 to M6 of the first pixel PXL1 may be positioned in the second direction Y with respect to the second transmission area TA2, and the initialization transistor TINT for initializing anode electrodes of the first light emitting elements LD1 of the first pixel PXL1 may be disposed in at least one of directions opposite to the first direction X with respect to the second transmission area TA2 or the first direction X with respect to the second transmission area TA2.

The initialization transistor TINT may include a first initialization transistor TINT1 and a second initialization transistor TINT2. The first initialization transistor TINT1 and the second initialization transistor TINT2 may be disposed in the same sub pixel. For example, the first initialization transistor TINT1 and the second initialization transistor TINT2 may be disposed in the fourth sub pixel SPX24 of the second pixel area PA2. In another embodiment, the first initialization transistor TINT1 and the second initialization transistor TINT2 may be disposed in any one of the first sub pixel SPX21, the second sub pixel SPX22, and the third sub pixel SPX23 of the second pixel area PA2. In still another embodiment, the first initialization transistor TINT1 and the second initialization transistor TINT2 may be disposed in different sub pixels.

For example, as shown in FIG. 9B, the initialization transistors TINT connected to the first light emitting elements LD1 of the first pixel PXL1 may be disposed in the first to fourth sub pixels SPX21 to SPX24 of the second pixel area PA2 respectively. For example, the initialization transistor TINT connected to a first light emitting element LD11 of the first pixel PXL1 may be disposed in the third sub pixel SPX23 of the second pixel area PA2, and the initialization transistor TINT connected to a first light emitting element LD12 of the first pixel PXL1 may be disposed in the fourth sub pixel SPX24 of the second pixel area PA2.

Referring back to FIG. 9A, one electrode of the initialization transistor TINT disposed in the second pixel area PA2 may be connected to the initialization power line VIL, and another electrode may be connected to the first light emitting element LD1 of the first pixel area PA1 through a connection line CNL which comprise a first connection line CNL1 and a second connection line CNL2.

The first initialization transistor TINT1 may be connected to the first light emitting element LD11 disposed in the first sub pixel SPX11 of the first pixel area PA1 through the first connection line CNL1, and the second initialization transistor TINT2 may be connected to the first light emitting element LD12 disposed in the second sub pixel SPX12 of the first pixel area PA1 through the second connection line CNL2.

The initialization transistor TINT may be turned on when an initialization signal of a gate-on voltage is supplied to the second initialization line SLq-1 disposed in the second pixel area PA2 to supply the initialization power voltage of the initialization power line VIL to the first light emitting element LD1 through the connection line CNL.

The initialization signal provided by the second initialization line SLq-1 of the second pixel area PA2 may be the same signal as the scan signal provided to the previous pixel row (for example, the first pixel row PXR1). That is, the signal provided by the second initialization line SLq-1 may be a signal substantially the same as the signal provided by the first scan line SLp of the first pixel area PA1.

The connection line CNL may be a conductive pattern including a metal material or a transparent conductive material. The connection line CNL may be disposed on the same layer as one configuration of the transistors disposed in the first pixel area PA1 and the second pixel area PA2. That is, the connection line CNL may be formed simultaneously with the one configuration of the transistors.

Referring further to FIG. 2B, in an embodiment, the connection line CNL may be formed between the base layer SUB and the gate electrode GAT. For example, the connection line CNL may be formed on the same layer as the body electrode BML. In another embodiment, the connection line CNL may be formed on the same layer as the gate electrode GAT of the first transistor M1. When the connection line CNL is formed on the same layer as the body electrode BML or the gate electrode GAT, the connection line CNL may be efficient in view of a design rule of the transistor. A disposition of the connection line CNL is not limited, and the connection line CNL may be formed on the same layer as the semiconductor pattern SC or the first and second metal patterns SDM1 and SDM2 and may be formed on a separate layer.

As shown in FIG. 9A, the first and second connection lines CNL1 and CNL2 connected to different first light emitting elements LD1 may be formed on the same layer. In this case, the first and second connection lines CNL1 and CNL2 may not overlap each other on a plane. However, the current disclosure is not limited, and the first and second connection lines CNL1 and CNL2 may be formed on different layers. In this case, the first and second connection lines CNL1 and CNL2 may overlap each other on a plane. This will be described later with reference to FIGS. 10A and 10B.

Similar to the first pixel area PA1, in the second pixel area PA2, a second initialization line SLq-1, a second scan line SLq, a second emission control line ELq, and the initialization power line VIL may be disposed, and thus various signals may be provided to the second pixel PXL2. In addition, second light emitting elements LD2 that emit light of different colors in correspondence with each of the first to fourth sub pixels SPX21 to SPX24 of the second pixel area PA2 may be disposed in the second pixel area PA2. As described above, the initialization transistor TINT disposed in the second pixel area PA2 may be connected to the first light emitting element LD1 of the first pixel area PA1. However, the initialization transistor TINT disposed in the second pixel area PA2 may not be connected to the second light emitting element LD2 of the second pixel area PA2.

In addition, the second light emitting element LD2 may be connected to the initialization transistor TINT disposed in a pixel area other than the second pixel area PA2. For example, the second light emitting element LD2 may be connected to a third initialization transistor TINT3 disposed in the third pixel area PA3.

That is, the initialization transistor TINT connected to the light emitting elements may be disposed in an area different from that of other components (for example, the first to sixth transistors M1 to M6 and the light emitting element LD) of the pixel.

As described above, when the initialization transistor TINT is disposed in the pixel area different from that of the first light emitting element LD1, the area of the transmission areas TA1, TA2, and TA3 may be expanded. For example, when the initialization transistor TINT of the first pixel PXL1 is disposed in the first pixel area PA1 rather than the second pixel area PA2, a bypass space of the signal lines SLq-1, SLq, and ELq and the initialization power line VIL for preparing the second transmission area TA2 may not be sufficiently secured. However, as shown in FIG. 9B, when the initialization transistor TINT is disposed in the pixel area (for example, the second pixel area PA2) different from that of the first light emitting elements LD1 disposed in the first pixel area PA1, the bypass space of the signal lines SLq-1, SLq, and ELq and the initialization power line VIL for preparing the second transmission area TA2 may be sufficiently secured, and thus a large area of the second transmission area TA2 may be formed.

When the area of the transmission areas TA1, TA2, and TA3 are expanded, the transmittance of the second display area AA2 may be improved. Accordingly, more signals (for example, optical signals) may be incident to the sensor 120 (i.e., FIG. 4) through the second display area AA2, and recognition accuracy and reliability of the sensor 120 may be improved.

Hereinafter, other embodiments of the display device will be described. In the following embodiments, the same configuration as the previously described embodiment will be referred to by the same reference numeral, description thereof will be omitted or simplified, and a difference will be mainly described.

Figure 10B:
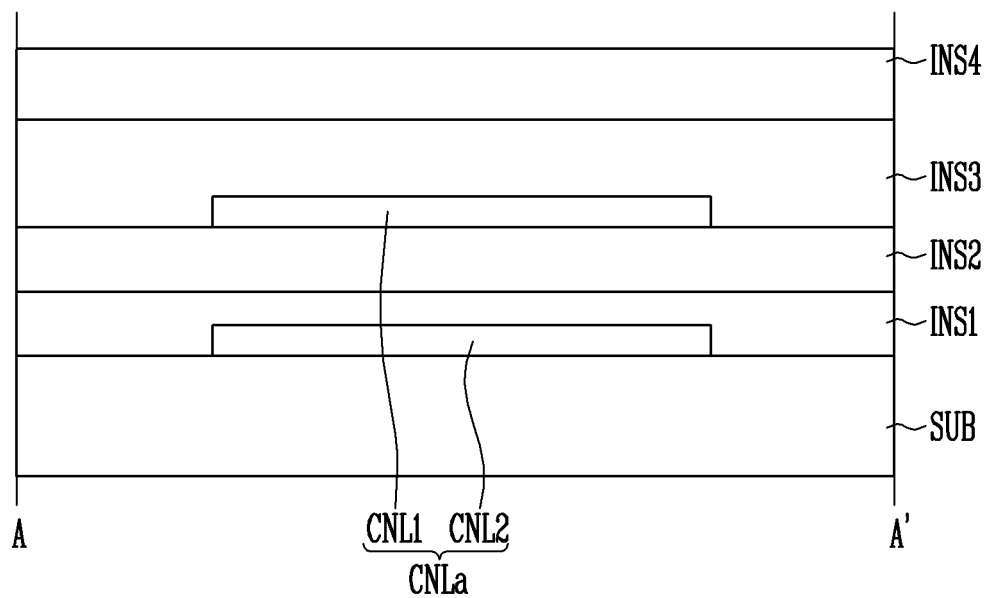
FIG. 10B is a schematic cross-sectional view taken along a line A-A' of FIG. 10A.

FIG. 10A is an enlarged view according to still another embodiment of the region Q2 of FIG. 8. FIG. 10B is a schematic cross-sectional view taken along a line A-A' of FIG. 10A.

The embodiment of FIGS. 10A and 10B is different from the embodiment of FIG. 9A in that connection lines connected to respective light emitting elements overlap each other on a plane.

Referring to FIGS. 8 and 10A, a second display area AA2' may include the first pixel area PA1, the second pixel area PA2, and the third pixel area PA3. The first pixel area PA1, the second pixel area PA2, and the third pixel area PA3 may be positioned in different pixel rows PXR1, PXR2, and PXR3, and first pixel area PA1, the second pixel area PA2, and the third pixel area PA3 may be positioned in different pixel columns PXC1 and PXC2. The first pixel PXL1, the second pixel PXL2, and the third pixel PXL3 may be disposed in the second display area AA2'. In addition, in the second display area AA2', the plurality of signal lines SLp-1, SLp, ELp, SLq-1, SLq, ELq, SLr-1, SLr, and ELr that transfer driving signals for driving each of the pixels PXL1, PXL2, and PXL3, and the initialization power lines VIL may be disposed in the second display area AA2'. The second display area AA2' may include the first transmission area TA1, the second transmission area TA2, and the third transmission area TA3 arranged between each of the pixel areas PA1, PA2, and PA3.

The first pixel PXL1 may include the first light emitting element LD1 and the initialization transistor TINT connected thereto. The first light emitting element LD1 may be disposed in each of the first to fourth sub pixels SPX11 to SPX14 of the first pixel area PA1, and the first light emitting elements LD1 may emit light of different colors respectively. The initialization transistor TINT may be disposed in a pixel area (for example, the second pixel area PA2) different from that of the first light emitting element LD1 disposed in the first pixel area PA1.

The initialization transistor TINT may include the first initialization transistor TINT1 and the second initialization transistor TINT2. The first initialization transistor TINT1 and the second initialization transistor TINT2 may be disposed in the same sub pixel. The first initialization transistor TINT1 and the second initialization transistor TINT2 may be connected to one of the first light emitting elements LD11, LD12 through a connection line CNLa. The connection line CNLa may include the first connection line CNL1 and the second connection line CNL2. The first initialization transistor TINT1 may be connected to one of the first light emitting element LD11 disposed in the first sub pixel SPX11 of the first pixel area PA1 through the first connection line CNL1 and the second initialization transistor TINT2 may be connected to the other of the first light emitting element LD12 disposed in the second sub pixel SPX12 of the first pixel area PA1 through the second connection line CNL2.

As shown in FIG. 10A, at least a portion of the first connection line CNL1 and the second connection line CNL2 may overlap each other on a plane.

Referring further to FIGS. 2B and 10B, at least a portion of the first connection line CNL1 and the second connection line CNL2 may overlap each other on a plane, and may be formed on different layers. Specifically, the first connection line CNL1 may be formed between the base layer SUB and the gate electrode GAT. For example, the first connection line CNL1 may be formed on the same layer as the body electrode BML of FIG. 2B. The second connection line CNL2 may be formed on the second insulating layer INS2. For example, the second connection line CNL2 may be formed on the same layer as the gate electrode GAT of FIG. 2B.

When the first connection line CNL1 and the second connection line CNL2 may be electrically separated from each other, a disposition of the respective connection lines CNL1 and CNL2 is not limited thereto. For example, the first connection line CNL1 may be formed on the same layer as the gate electrode GAT, and the second connection line CNL2 may be formed on the same layer as the body electrode BML. In addition, the first connection line CNL1 and the second connection line CNL2 may be formed on the same layer as the semiconductor pattern SC or the first and second metal patterns SDM1 and SDM2, and may be formed on a separate layer.

As described above, when the first connection line CNL1 and the second connection line CNL2 overlap each other, a space for providing the second transmission area TA2 disposed between the second pixel areas PA2 may be further expanded. That is, transmission areas wider than that of the embodiment of FIG. 9A may be provided. Accordingly, the area of the transmission areas TA1, TA2, and TA3 may be expanded, and the transmittance of the second display area AA2 may be further improved.

Figure 11:
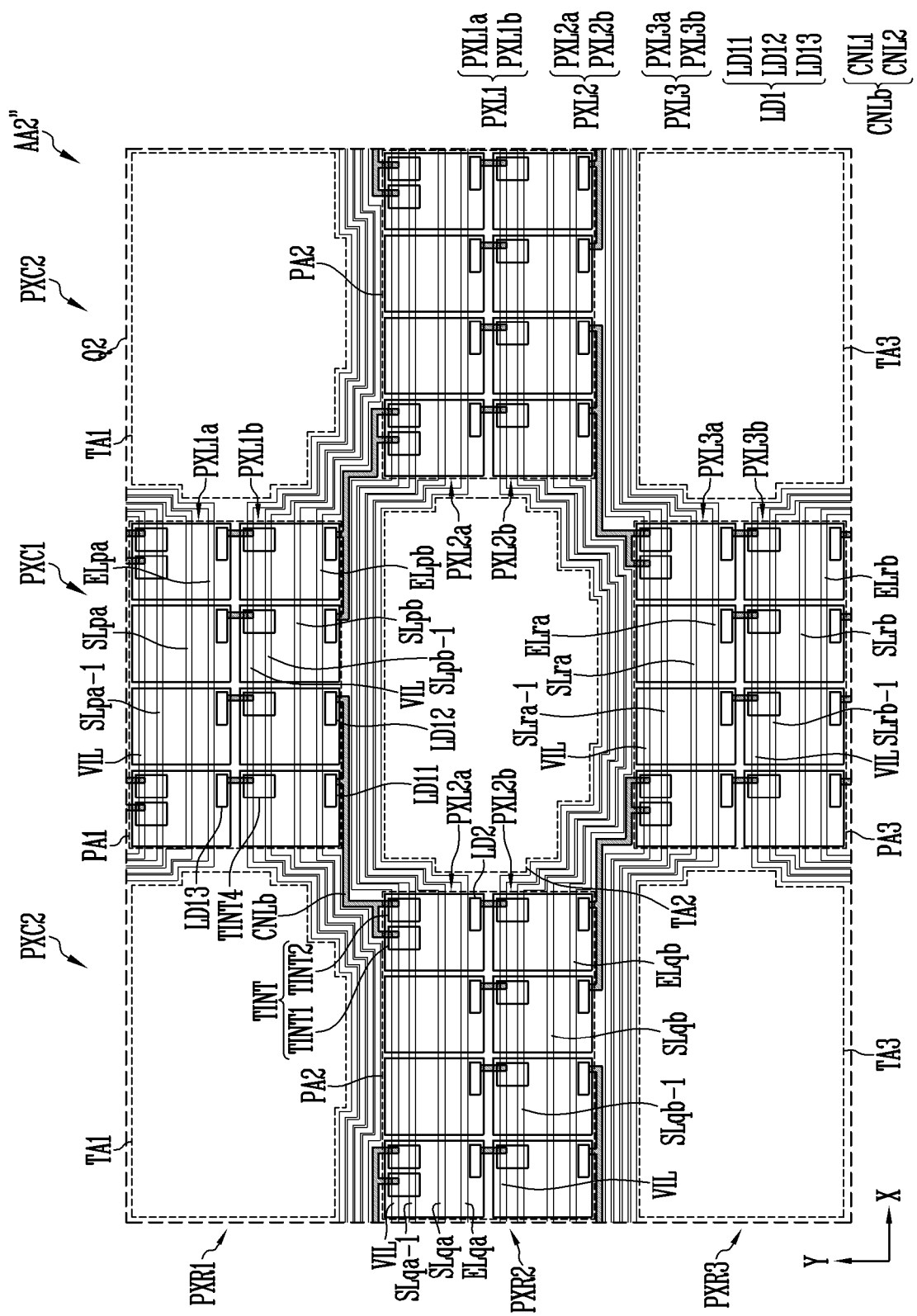
FIG. 11 is an enlarged view according to still another embodiment of the region Q2 of FIG. 8.

FIG. 11 is an enlarged view according to still another embodiment of the region Q2 of FIG. 8.

The embodiment of FIG. 11 is different from the previous embodiments in that a plurality of sub pixel rows are disposed in one pixel area.

Referring to FIGS. 8 and 11, a second display area AA2" may include the first pixel area PA1, the second pixel area PA2, and the third pixel area PA3. Each of the pixel areas PA1, PA2, and PA3 may include a plurality of sub pixels (or sub pixel areas) that emit light of the same or different colors. The second display area AA2" may include the first transmission area TA1, the second transmission area TA2, and the third transmission area TA3 arranged between each of the pixel areas PA1, PA2, and PA3.

The first pixel PXL1, the second pixel PXL2, and the third pixel PXL3 may be disposed in the second display area AA2". Each of the first pixel PXL1, the second pixel PXL2, and the third pixel PXL3 may include first sub pixel rows PXL1a, PXL2a, and PXL3a (or a first sub pixel area) and second sub pixel rows PXL1b, PXL2b, and PXL3b (or a second sub pixel area) arranged along the second direction Y. Each of the sub pixel rows may include a plurality of sub pixels arranged along the first direction X.

In addition, a plurality of signal lines SLpa-1, SLpb-1, SLpa, SLpb, ELpa, ELpb, SLqa-1, SLqb-1, SLqa, SLqb, ELqa, ELqb, SLra-1, SLrb-1, SLra, SLrb, ELra, and ELrb that transfer driving signals for driving each of the pixels PXL1, PXL2, and PXL3, and the initialization power lines VIL may be disposed in the second display area AA2".

The plurality of signal lines SLpa-1, SLpb-1, SLpa, SLpb, ELpa, ELpb, SLqa-1, SLqb-1, SLqa, SLqb, ELqa, ELqb, SLra-1, SLrb-1, SLra, SLrb, ELra, and ELrb may include initialization lines SLpa-1, SLpb-1, SLqa-1, SLqb-1, SLra-1, and SLrb-1 that provide an initialization signal, scan lines SLpa, SLpb, SLqa, SLqb, SLra, and SLrb that provide a scan signal, emission control lines ELpa, ELpb, ELqa, ELqb, ELra, and ELrb that provide an emission control signal. The plurality of signal lines SLpa-1, SLpb-1, SLpa, SLpb, ELpa, ELpb, SLqa-1, SLqb-1, SLqa, SLqb, ELqa, ELqb, SLra-1, SLrb-1, SLra, SLrb, ELra, and ELrb and the initialization power lines VIL may be disposed to pass through each of the pixel areas PA1, PA2, and PA3.

For example, in the first pixel area PA1, first initialization lines SLpa-1 and SLpb-1, first scan lines SLpa and SLpb, first emission control lines ELpa and ELpb, and the initialization power lines VIL may be disposed, and thus various signals may be provided to the first pixel PXL1. In addition, the first light emitting elements LD1 that emit light of different colors may be disposed in the first pixel area PA1.

The light emitting elements disposed in the first sub pixel rows PXL1a, PXL2a, and PXL3a (or the first sub pixel area) may be connected to the initialization transistors disposed in the second sub pixel rows PXL1b, PXL2b, and PXL3b (or the second sub pixel area), respectively. For example, a first light emitting element LD13 disposed in the first sub pixel row PXL1a of the first pixel area PA1 may be connected to a fourth initialization transistor TINT4 disposed in the second sub pixel row PXL1b of the first pixel area PA1. That is, some (the initialization transistor) of pixel circuits of the first sub pixel rows PXL1a, PXL2a, and PXL3a may be disposed in the second sub pixel rows PXL1b, PXL2b, and PXL3b (or the second sub pixel area).

The light emitting elements disposed in the second sub pixel rows PXL1b, PXL2b, and PXL3b may be connected to initialization transistors disposed in the first sub pixel rows PXL1a, PXL2a, and PXL3a positioned in another pixel area through a connection line CNLb. The connection line CNLb may include the first connection line CNL1 and the second connection line CNL2. For example, the first light emitting element LD11 disposed in the second sub pixel row PXL1b of the first pixel area PA1 may be connected to the first initialization transistor TINT1 disposed in the first sub pixel row PXL2a through the first connection line CNL1, and the first light emitting element LD12 disposed in the second sub pixel row PXL1b of the first pixel area PA1 may be connected to the second initialization transistor TINT2 disposed in first sub pixel row PXL2a of second pixel area PA2 through the second connection line CNL2.

The light emitting elements and the initialization transistor disposed in the same sub pixel row may not be connected to each other. For example, the first light emitting element LD11 disposed in the second sub pixel row PXL1b of the first pixel area PA1 may not be connected to the fourth initialization transistor TINT4 disposed in the same sub pixel row as the first light emitting element LD11.

The first connection line CNL1 and the second connection line CNL2 may overlap each other on a plane. In this case, the first connection line CNL1 and the second connection line CNL2 may be formed on different layers as described with reference to FIGS. 10A and 10B. Accordingly, the area of the transmission areas TA1, TA2, and TA3 may be further expanded, and the transmittance of the second display area AA2" may be improved.

FIG. 11 illustrates a structure in which two sub pixel rows are disposed in one pixel area, but is not limited. According to an embodiment, three or more sub pixel rows may be disposed along the second direction Y in each of the pixel areas PA1, PA2, and PA3.

Although the embodiments of the disclosure have been described with reference to the accompanying drawings, it will be understood by those skilled in the art to which the disclosure pertains that the embodiments may be implemented in other specific forms without changing the technical spirit and essential features of the current disclosure. Therefore, it should be understood that the embodiments described above are illustrative and are not restrictive in all aspects.

What is claimed is:
1. A display device comprising:
 a substrate including a sensor area;
 a display panel including a first pixel disposed in the sensor area; and
 a sensor disposed between the substrate and the display panel and overlapping the sensor area,
 wherein the sensor area includes a plurality of pixel areas in which the first pixel is disposed and a plurality of transmission areas in which the first pixel is not disposed,
 the plurality of transmission areas include a first transmission area,
 the plurality of pixel areas include a first pixel area positioned in a first direction of the first transmission area and a second pixel area positioned in a second direction crossing the first direction of the first transmission area,
 the first pixel includes a first pixel circuit, at least one of transistors of the first pixel circuit is disposed in the first pixel area, and others of the transistors of the first pixel circuit are disposed in the second pixel area, wherein the display panel includes a first scan line, a first initialization line, and a first emission control line connected to the first pixel circuit, and wherein the first scan line, the first initialization line, and the first emission control line pass through the first pixel area and bypass the transmission area adjacent to the first pixel area.

2. The display device according to claim 1, wherein the first pixel circuit includes a first initialization transistor disposed in the second pixel area and connected between a first light emitting element of the first pixel and an initialization power.

3. The display device according to claim 1, wherein the pixel circuit further includes a first transistor, a second transistor, and a capacitor disposed in the first pixel area, the first transistor controls a current amount flowing from a first power to a second power via the first light emitting element in correspondence with a voltage of a first node, the second transistor is connected between a data line and a first electrode of the first transistor, and is turned on when a scan signal is supplied to the first scan line, and the capacitor is connected between the first power and the first node.

4. The display device according to claim 3, wherein the pixel circuit further includes a third transistor, a fourth transistor, a fifth transistor, and a sixth transistor disposed in the first pixel area, the third transistor is connected between the first node and a second electrode of the first transistor, and is turned on when the scan signal is supplied to the first scan line, the fourth transistor is connected between the first node and the initialization power, and is turned on when an initialization signal is supplied to the first initialization line, the fifth transistor is connected between the first power and the first electrode of the first transistor, and is turned on when an emission control signal is supplied to the first emission control line, and the sixth transistor is connected between the second electrode of the first transistor and a first electrode of the first light emitting element, and is turned on when the emission control signal is supplied to the first emission control line.

5. The display device according to claim 1, wherein the pixel areas further include a third pixel area positioned in a direction opposite to the first direction of the first transmission area, a second pixel is further disposed in the pixel areas, the second pixel includes a second pixel circuit, at least one portion of the second pixel circuit is disposed in the second pixel area, and an other portion of the second pixel circuit is disposed in the third pixel area.

6. The display device according to claim 5, wherein the second pixel circuit includes a second initialization transistor disposed in the third pixel area and connected between a second light emitting element of the second pixel and the initialization power.

7. The display device according to claim 6, wherein the display panel includes a second scan line and a second initialization line connected to the second pixel circuit, and the second scan line and the second initialization line pass through the second pixel area and bypass the transmission area adjacent to the second pixel area.

8. The display device according to claim 7, wherein the first initialization transistor is turned on when an initialization signal is supplied to the second initialization line.

9. The display device according to claim 8, wherein the initialization signal supplied to the second initialization line is equal to the scan signal supplied to the first scan line.

10. The display device according to claim 1, wherein the pixel areas further include a third pixel area positioned in the first direction of the first pixel area, a second pixel is further disposed in the pixel areas, the second pixel includes a second pixel circuit, at least one portion of the second pixel circuit is disposed in the third pixel area, and an other portion of the second pixel circuit is disposed in the first pixel area.

11. The display device according to claim 10, wherein the second pixel circuit includes a second initialization transistor disposed in the first pixel area and connected between a second light emitting element of the second pixel and the initialization power.

12. The display device according to claim 1, wherein the display panel further includes a display area in which a display pixel is disposed, the display area surrounds the sensor area, and a disposition density of the first pixels disposed in the sensor area is lower than a disposition density of the display pixels disposed in the display area.

13. The display device according to claim 12, wherein a size of the first pixels disposed in the sensor area is smaller than a size of the display pixels disposed in the display area.

14. The display device according to claim 12, wherein a transmittance of the sensor area is greater than a transmittance of the display area.

15. A display device comprising:

a substrate including a sensor area;

a display panel including a first pixel disposed in the sensor area; and a sensor disposed between the substrate and the display panel and overlapping the sensor area, wherein the sensor area includes a plurality of pixel areas in which the first pixel is disposed and a plurality of transmission areas in which the first pixel is not disposed, the plurality of transmission areas include a first transmission area, the plurality of pixel areas include a first pixel area positioned in a first direction of the first transmission area and a second pixel area positioned in a second direction crossing the first direction of the first transmission area, the first pixel includes a first pixel circuit, at least one of transistors of the first pixel circuit is disposed in the first pixel area, and others of the transistors of the first pixel circuit are disposed in the second pixel area, wherein the first pixel circuit includes a first initialization transistor disposed in the second pixel area and connected between a first light emitting element of the first pixel and an initialization power, and wherein the display panel includes a connection pattern that electrically connects an anode electrode of the first light emitting element and the first initialization transistor to each other and is not overlapping the transmission areas.

16. The display device according to claim 15, wherein at least one of the transistors included in the first pixel circuit comprises:
- a base layer disposed on the substrate;
- a semiconductor pattern disposed on the base layer;
- a gate electrode disposed on the semiconductor pattern; and
- a first metal pattern and a second metal pattern that is disposed on the gate electrode and is in contact with the semiconductor pattern, and
- the connection pattern is formed between the base layer and the gate electrode or on the same layer as the gate electrode.

17. A display device comprising:
- a substrate including a sensor area;
- a display panel including a first pixel circuit and a second pixel circuit disposed in the sensor area; and
- a sensor disposed between the substrate and the display panel and overlapping the sensor area,
- wherein the sensor area includes a transmission area,
- at least one of the transistors of the first pixel circuit is disposed adjacent to a first direction of the transmission area,
- others of the transistors of the first pixel circuit are disposed adjacent to a second direction crossing the first direction of the transmission area, and
- the second pixel circuit is disposed adjacent to the second direction of the transmission area,
- wherein the display panel includes a first scan line, a first initialization line, and a first emission control line connected to the first pixel circuit, and
- wherein the first scan line, the first initialization line, and the first emission control line pass through a region adjacent to the first direction of the transmission area and bypass the transmission area.

18. The display device according to claim 17, wherein the display panel further includes a first light emitting element disposed adjacent to the first direction of the transmission area and connected to the first pixel circuit,
- the first pixel circuit includes an initialization transistor disposed adjacent to the second direction of the transmission area, and
- the initialization transistor is connected between an anode electrode of the first light emitting element and an initialization power.

19. The display device according to claim 17, wherein the display panel further includes a third pixel circuit,
- at least one of the transistors of the third pixel circuit is disposed adjacent to the second direction of the second pixel circuit, and
- others of the transistors of the third pixel circuit are disposed adjacent to the second direction of the transmission area. on area.

* * * * *